United States Patent
Yang

(10) Patent No.: US 12,021,017 B2
(45) Date of Patent: Jun. 25, 2024

(54) SEMICONDUCTOR PACKAGE AND MANUFACTURING METHOD THEREOF

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 119 days.

(21) Appl. No.: 17/492,093

(22) Filed: Oct. 1, 2021

(65) Prior Publication Data

US 2023/0109136 A1 Apr. 6, 2023

(51) Int. Cl.
*H01L 23/495* (2006.01)
*H01L 23/00* (2006.01)
*H01L 23/31* (2006.01)
*H01L 23/498* (2006.01)

(52) U.S. Cl.
CPC .... *H01L 23/49838* (2013.01); *H01L 23/3128* (2013.01); *H01L 24/48* (2013.01); *H01L 2224/48227* (2013.01)

(58) Field of Classification Search
CPC .......... H01L 23/49838; H01L 23/3128; H01L 24/48; H01L 2224/48227
USPC ....................................................... 257/668
See application file for complete search history.

(56) References Cited

U.S. PATENT DOCUMENTS

| 8,324,646 B2 * | 12/2012 | Lee ........................ H01L 33/62 257/E33.059 |
| 8,952,404 B2 * | 2/2015 | Yoo ........................ H01L 33/54 257/E33.056 |
| 10,332,850 B2 * | 6/2019 | Beyne ................ H01L 21/4853 |
| 2012/0187437 A1 | 7/2012 | Yoo et al. |
| 2022/0028798 A1 * | 1/2022 | Sirinorakul ......... H01L 23/4334 |

FOREIGN PATENT DOCUMENTS

CN         107706158 A    2/2018

* cited by examiner

*Primary Examiner* — Caleb E Henry
*Assistant Examiner* — Dilinh P Nguyen
(74) *Attorney, Agent, or Firm* — Muncy, Geissler, Olds & Lowe, P.C.

(57) ABSTRACT

The present application provides a semiconductor package and a manufacturing method thereof. The semiconductor package includes a semiconductor die, a package substrate and bonding wires. The semiconductor die has I/O pads arranged at an active side. The package substrate is provided with a first side attached to the active side of the semiconductor die and a second side facing away from the semiconductor die, and has an opening penetrating through the package substrate. The I/O pads are overlapped with the opening. A width of the opening at the second side of the package substrate is greater than a width of the opening at the first side of the package substrate. The bonding wires connect the I/O pads to the second side of the package substrate through the opening of the package substrate.

20 Claims, 21 Drawing Sheets

SEMICONDUCTOR PACKAGE AND MANUFACTURING METHOD THEREOF

TECHNICAL FIELD

The present disclosure relates to a semiconductor package and a manufacturing method thereof, and more particularly, to a ball-grid-array (BGA) semiconductor package and a manufacturing method thereof.

DISCUSSION OF THE BACKGROUND

BGA package is a type of surface mount package used in electronic products to mount integrated circuits, and interconnection pins in the BGA package are in a form of solder balls. The solder balls provide short connection paths to a printed circuit board (PCB), and therefore reduce impedance therebetween. As compared to dual in-line or flat semiconductor packages of which only peripheral regions are used for interconnection pins, entire bottom surface of the BGA package is available for interconnection pins (i.e., the solder balls). Therefore, the BGA package can provide more connections within a given area.

In order to shorten connections between the chip and the package substrate in the BGA package, the chip may be attached to the package substrate by a face-down manner. A flip chip bonding process is used for realizing such face-down bonding. However, the flip chip bonding process is not perfect. At least, the flip chip is not a cost effective method, as compared to wire bonding or other bonding techniques.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In an aspect of the present disclosure, a semiconductor package is provided. The semiconductor package comprises: a semiconductor die, having I/O pads arranged at an active side of the semiconductor die; a package substrate, with a first side attached to the active side of the semiconductor die and a second side facing away from the semiconductor die, and having an opening penetrating through the package substrate, wherein the I/O pads are overlapped with the opening, and a width of the opening at the second side of the package substrate is greater than a width of the opening at the first side of the package substrate; and bonding wires, connecting the I/O pads to the second side of the package substrate through the opening of the package substrate.

In another aspect of the present disclosure, a semiconductor package is provided. The semiconductor package comprises: a semiconductor die, having I/O pads arranged at an active side of the semiconductor die; a package substrate, with a first side attached to the active side of the semiconductor die and a second side facing away from the semiconductor die, and laterally surrounding an opening, wherein the I/O pads are overlapped with the opening, the opening has long sides and short sides, a width across the long sides of the opening at the second side of the package substrate is greater than a width across the long sides the opening at the first side of the package substrate; and bonding wires, connecting the I/O pads to the second side of the package substrate across the long sides of the opening.

In yet another aspect of the present disclosure, a semiconductor package is provided. The semiconductor package comprises: a semiconductor die, having I/O pads arranged at an active side of the semiconductor die; a package substrate, with a first side attached to the active side of the semiconductor die and a second side facing away from the semiconductor die, and having an opening penetrating through the package substrate, wherein the I/O pads are overlapped with the opening, and a width of the opening at the second side of the package substrate is greater than a width of the opening at the first side of the package substrate; bonding wires, connecting the I/O pads to the second side of the package substrate through the opening of the package substrate; a first encapsulant, laterally encapsulating the semiconductor die; and a second encapsulant, filling up the opening and extending to the second side of the package substrate.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
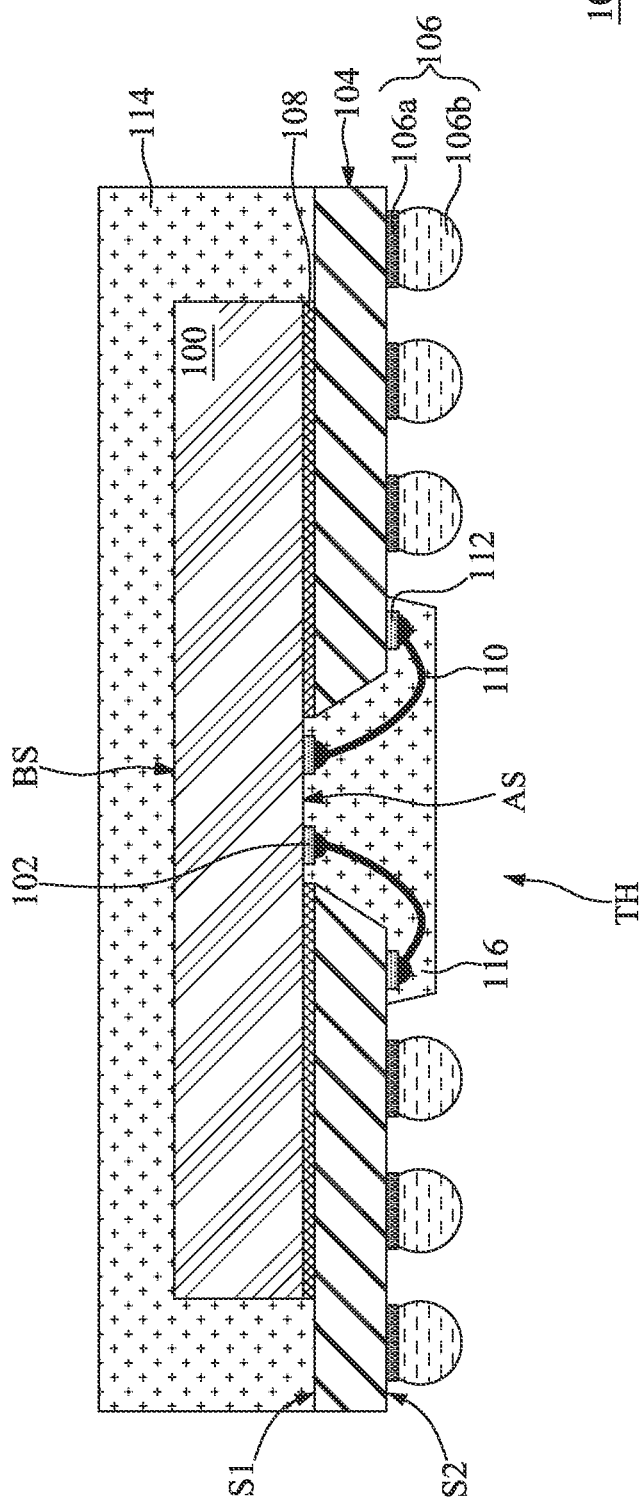
FIG. 1A is a schematic cross-sectional view illustrating a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view illustrating a semiconductor package 10 according to some embodiments of the present disclosure.

Referring to FIG. 1A, a semiconductor die 100 is mounted in the semiconductor package 10. The semiconductor die 100 is one of the pieces singulated from a device wafer. In some embodiments, the semiconductor die 100 is a memory die, such as a double data rate fourth generation (DDR4) dynamic random access memory (DRAM) die. Integrated circuits (e.g., memory circuits) may be built on a front surface of a semiconductor substrate in the semiconductor die 100, and a side of the semiconductor die 100 at which the integrated circuit is formed may be described as an active side AS. Input/output (I/O) pads 102 are formed at the active side AS, and functioned as I/Os of the integrated circuit. Signals can be provided to or output from the semiconductor die 100 through the I/O pads 102.

Figure 1B:
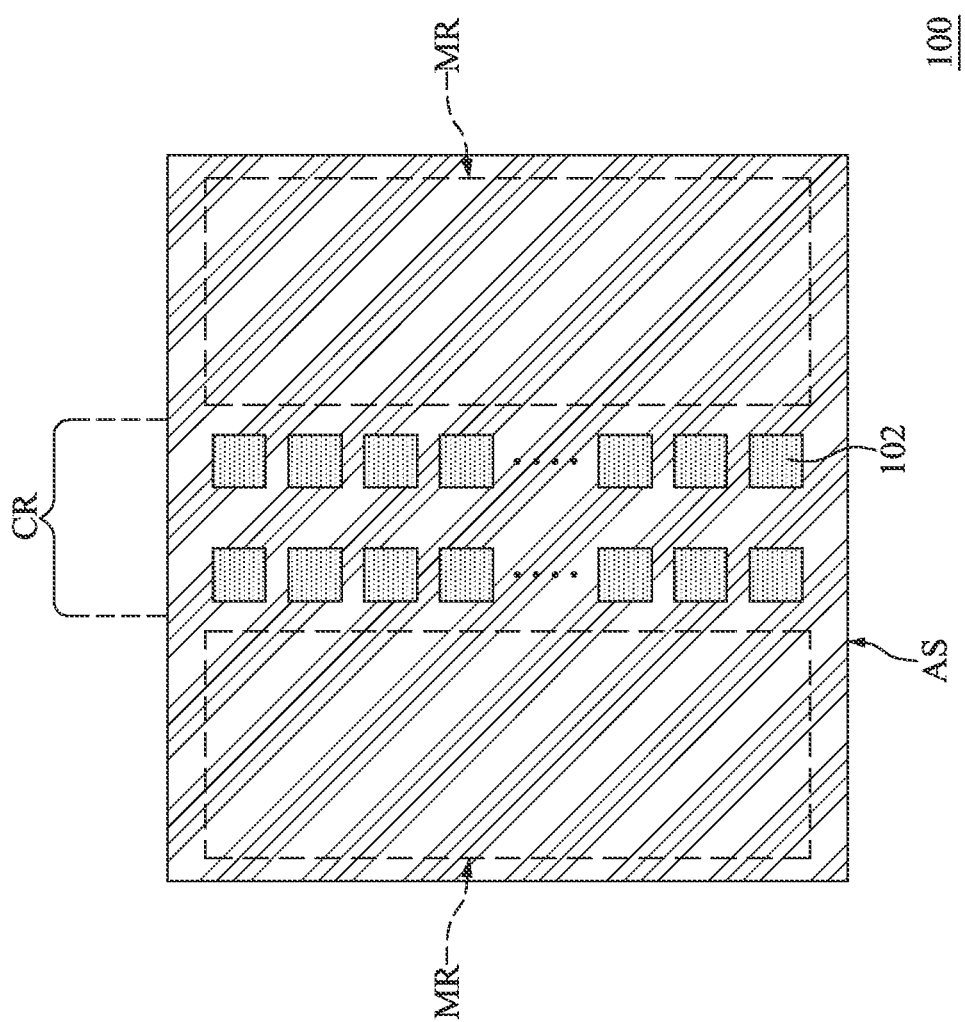
FIG. 1B is a schematic plan view illustrating an active side of the semiconductor die, according to some embodiments of the present disclosure.

FIG. 1B is a schematic plan view illustrating the active side AS of the semiconductor die 100, according to some embodiments of the present disclosure.

Referring to FIG. 1A and FIG. 1B, in some embodiments, the I/O pads 102 are arranged within a central region CR of the active side AS. As an example, the I/O pads 102 may be arranged along two columns in the central region CR. In those embodiments where the semiconductor die 100 is a memory die, memory arrays MR in the semiconductor die 100 may be located at opposite sides of the I/O pads 102, and are routed to the I/O pads 102. Further, driving circuits (not shown) for facilitating operations of the memory arrays MR may be disposed around the memory arrays MR, and are connected to the memory arrays MR and the I/O pads 102. Since the memory arrays MR are buried in the semiconductor die 100, they are schematically depicted by ghost lines in FIG. 1B. Further, the I/O pads 102 and the memory arrays MR may be alternatively arranged as other possible configuration, the present disclosure is not limited to the configuration of the I/O pads 102 and/or the memory arrays MR.

Referring to FIG. 1A, the semiconductor die 100 is attached to a package substrate 104. Although not shown, the package substrate 104 may include wirings embedded in a stack of insulating layers. The wirings are configured to out route the I/O pads 102 of the semiconductor die 100. In some embodiments, the package substrate 104 has a dielectric core, and the insulating layers as well as the wirings are formed on single or opposite sides of the dielectric core. In alternative embodiments, the package substrate 104 is a core-less package substrate, and the insulating layers are stacked without an intervening dielectric core. Further, package I/Os 106 are disposed at a side of the package substrate 104 facing away from the semiconductor die 100. The I/O pads 102 of the semiconductor die 100 may be connected to the package I/Os 106 through the wirings in the package substrate 104. In some embodiments, the semiconductor package 10 is a ball-grid-array (BGA) package. In these embodiments, the package I/Os 106 may include solder pastes 106a and solder balls 106b.

The semiconductor die 100 may be attached to the package substrate 104 by the active side AS. In some embodiments, an adhesive 108 may be disposed between the active side AS of the semiconductor die 100 and the package substrate 104, in order to facilitate attachment of the semiconductor die 100 and the package substrate 104. The adhesive 108 may be provided on a region of the active side AS of the semiconductor die 100 that is overlapped with the package substrate 104, or provided on a portion of the package substrate 104 to be attached with the semiconductor die 100. The I/O pads 102 at the active side AS of the semiconductor die 100 may be laterally surrounded by the adhesive 108. In those embodiments where the I/O pads 102 are formed within the central region CR of the active side AS of the semiconductor die 100 (as described with reference to FIG. 1B), the adhesive 108 may have a central opening overlapped with the I/O pads 102, and cover rest region of the active side AS of the semiconductor die 100.

As similar to the adhesive 108 used in some embodiments, the package substrate 104 has an opening TH overlapped with the I/O pads 102. The opening TH extends through the package substrate 104 from a first side S1 of the package substrate 104 attached with the semiconductor die 100, to a second side S2 of the package 104 formed with the package I/Os 106. To express in another way, the package substrate 104 laterally surrounds the opening TH. The I/O pads 102 of the semiconductor die 100 are routed to the second side S2 of the package substrate 104 through bonding wires 110 passing through the opening TH of the package substrate 104. In some embodiments, the bonding wires 110 connect the I/O pads 102 to conductive pads 112 formed at the second side S2 of the package substrate 104. The conductive pads 112 may be arranged around the opening TH of the package substrate 104, and are routed to the package I/Os 106 through the wirings in the package substrate 104. In other words, the I/O pads 102 of the semiconductor die 100 can be routed to the package I/Os 106 through the bonding wires 110, the conducive pads 112 at the second side S2 of the package substrate 104 and the wirings embedded in the package substrate 104.

Figure 1C:
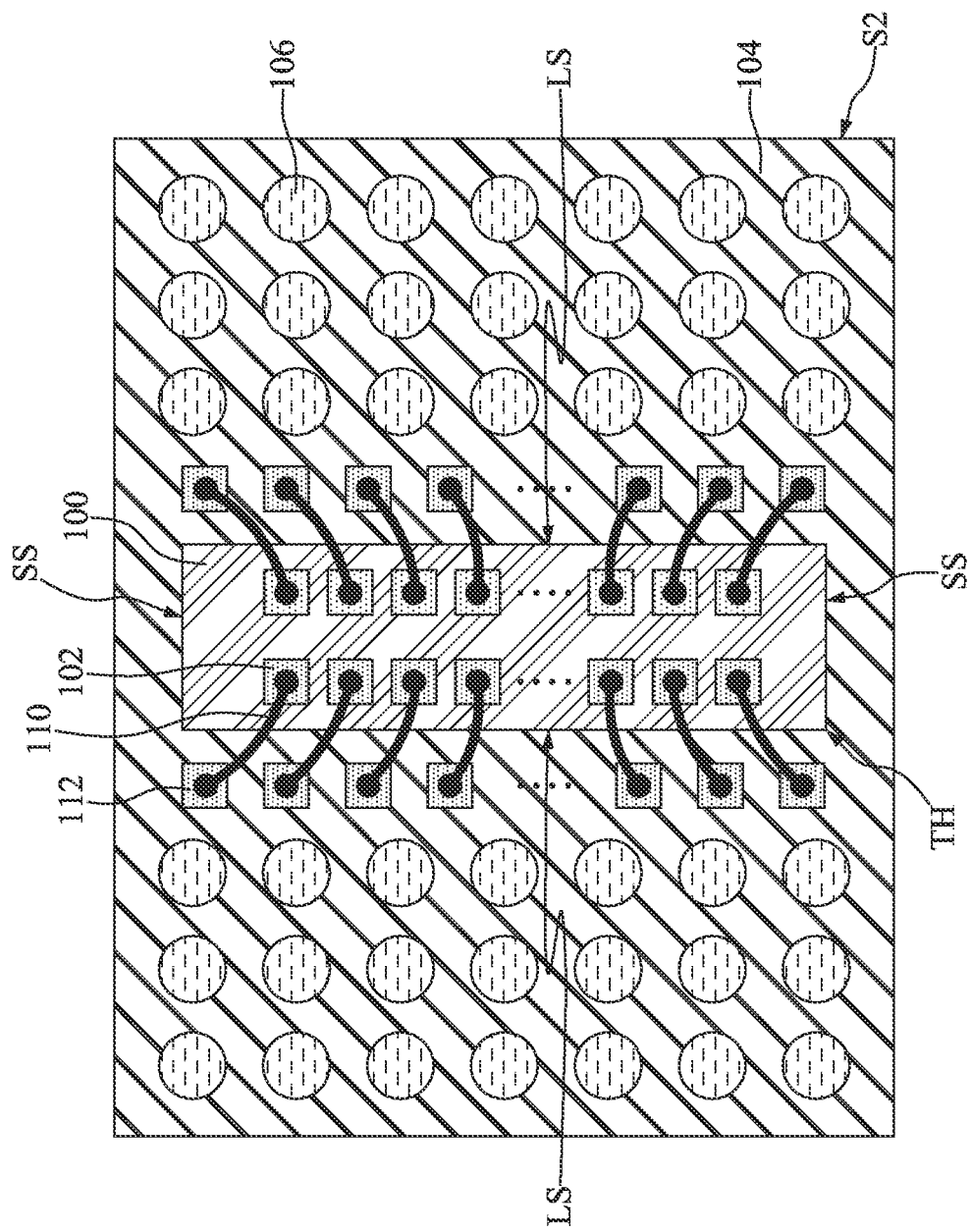
FIG. 1C is a schematic plan view illustrating a bottom side of the semiconductor package as shown in FIG. 1A, according to some embodiments of the present disclosure.

FIG. 1C is a schematic plan view illustrating a bottom side of the semiconductor package 10 as shown in FIG. 1A, according to some embodiments of the present disclosure.

Referring to FIG. 1A and FIG. 1C, the I/O pads 102 of the semiconductor die 100 are located within a boundary of the opening TH of the package substrate 104. In addition, the conductive pads 112 outside the opening TH may be arranged along the boundary of the opening TH. In some embodiment, the I/O pads 102 and the conductive pads 112 are arranged along long sides LS of the opening TH, and the bonding wires 110 respectively extending between one of the I/O pads 102 and the corresponding conductive pad 112 may extend across one of the long sides LS of the opening TH. According to some embodiments shown in FIG. 1C, the opening TH is formed in a rectangular shape, and a first column of the I/O pads 102 as well as a first column of the conductive pads 112 may be arranged along a left long side LS of the opening TH, while a second column of the I/O pads 102 and a second column of the conductive pads 112 may be arranged along a right long side LS of the opening TH. On the other hand, short sides SS of the opening TH may not be lined with the conductive pads 112. In alternative embodiments, the conductive pads 112 may be arranged along both of the long sides LS and the short sides SS of the opening TH. In these alternative embodiments, some of the bonding wires 110 may extend across the long sides LS of the opening TH, and others of the bonding wires 110 may extend across the short sides SS of the opening TH. Further, in yet other embodiments, the opening TH is formed in a rectangular shape with rounded ends, such that the short sides SS would be curves rather than straight lines as shown in FIG. 1C. Although not being described in detail, the opening TH of the package substrate 104 may be alternatively formed in any other shape, as long as the opening TH is overlapped with the I/O pads 102.

As shown in FIG. 1C, the long sides LS may extend along a direction Y, and the short sides SS may extend along a direction X perpendicular to the direction Y. In addition, FIG. 1A shows a cross-sectional view along the direction X.

Referring to FIG. 1C again, the package I/Os 106 may be distributed within regions of the second side S2 of the package substrate 104 that surround the opening TH but not occupied by the conductive pads 112. In some embodiments, the conductive pads 112 are arranged between the opening TH and the package I/Os 106. As an example shown in FIG. 1C, a first column of the conductive pads 112 are disposed between a left long side LS of the opening TH and a first array of the package I/Os 106, and a second column of the conductive pads 112 are disposed between a right long side LS of the opening TH and a second array of the package I/Os 106. Moreover, if a spacing between each short side SS of the opening TH and an outer boundary of the package substrate 104 is great enough, the package I/Os 106 may be further disposed between the short sides SS of the opening TH and the outer boundary of the package substrate 104.

Figure 1D:
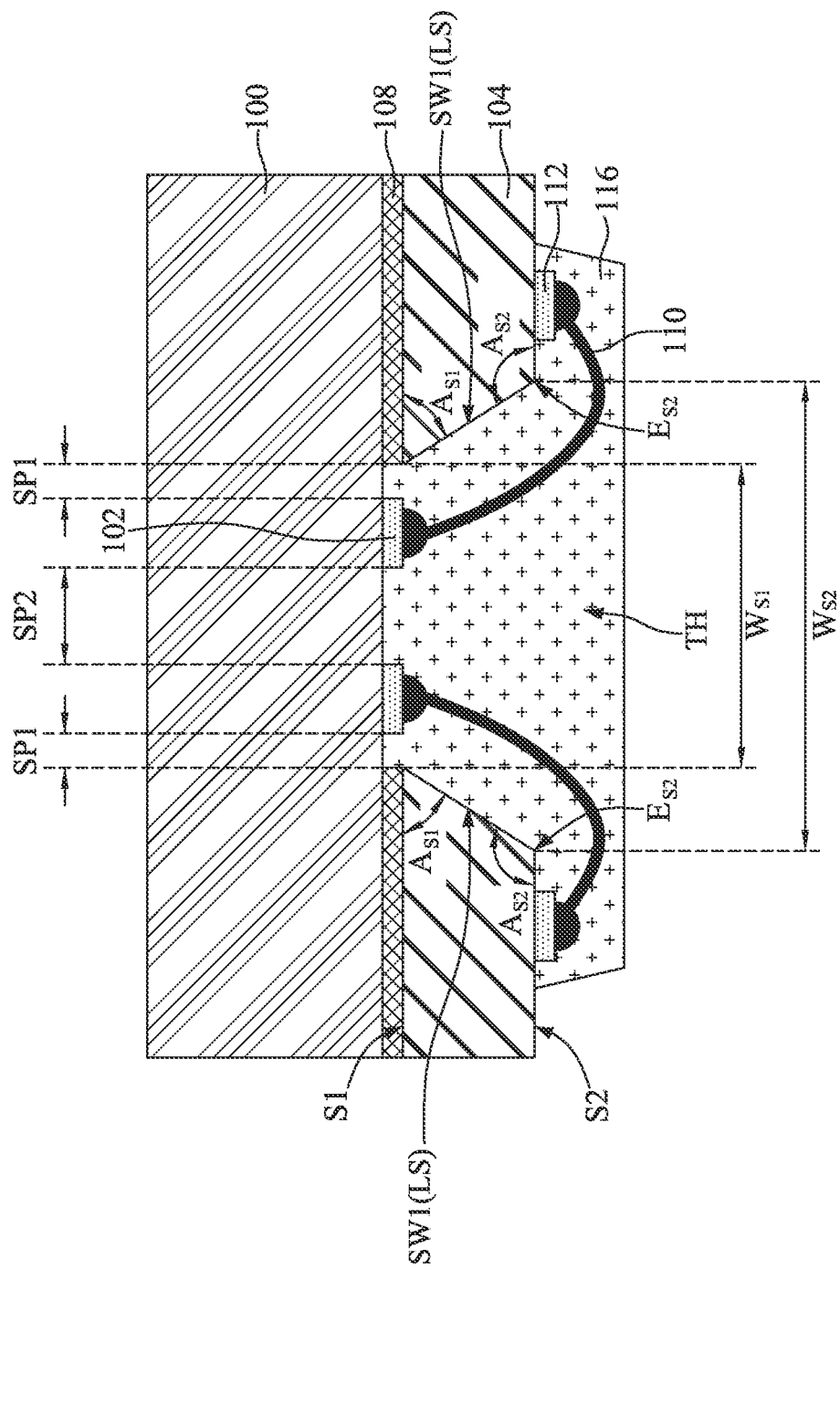
FIG. 1D is an enlarged schematic view illustrating an opening of a package substrate in the semiconductor package, according to some embodiments of the present disclosure.

FIG. 1D is an enlarged schematic view illustrating the opening TH of the package substrate 104, according to some embodiments of the present disclosure.

Referring to FIG. 1C and FIG. 1D, the opening TH of the package substrate 104 has a first width $W_{S1}$ at the first side S1 of the package substrate 104, and has a second width $W_{S2}$ at the second side S2 of the package substrate 104. The first and second widths $W_{S1}$, $W_{S2}$ are measured along a direction intersected with the long sides LS of the opening TH. In those embodiments where the long sides LS of the opening TH extend along the direction Y, the first and second widths $W_{S1}$, $W_{S2}$ may be measured along the direction X. The second width $W_{S2}$ is designed to be greater than the first width $W_{S1}$, in order to adequately space apart the bonding wires 110 and edges $E_{S2}$ of the opening TH at the second side S2 of the package substrate 104. As a result, physical contact between the bonding wires 110 and the edges $E_{S2}$ of the opening TH during formation of the bonding wires 110 can be avoided. Such physical contact may result in damage of the bonding wires 110, thus electrical connection between the semiconductor die 100 and the package substrate 104 may be compromised. In other words, by designing the opening TH with the second width $W_{S2}$ greater than the first width $W_{S1}$, promising connection between the semiconductor die 100 and the package substrate 104 can be further ensured. Further, by properly spacing apart the edges $E_{S2}$ of the package substrate 104 from extending paths of the bonding wires 110, the edge $E_{S2}$ of the package substrate 104 can be avoided from being hit by a bonding tool used during formation of the bonding wires 110. Therefore, possible damages on the package substrate 104 during formation of the bonding wires 110 can be effectively prevented. In some embodiments, a ratio of the second width $W_{S2}$ over the first width $W_{S1}$ ranges from 1.25 to 1.3. For instance, the second width $W_{S2}$ may range from 1000 to 1300 μm, while the first width $W_{S1}$ may range from 800 to 1000 μm.

Moreover, since a safe distance can be kept between the edges $E_{S2}$ of the package substrate 104 and the bonding wires 110, the I/O pads 102 as bounds of the bonding wires 110 may be positioned closer to the long sides LS of the opening TH. In some embodiments, a lateral spacing SP1 between each I/O pad 102 and the most adjacent edge of the opening TH at the first side S1 of the package substrate 104 ranges from 100 to 400 μm. By having the I/O pads 102 closer to the long sides LS of the opening TH, a lateral spacing SP2 between columns of the I/O pads 102 may be increased. In other words, larger area between columns of the I/O pads 102 can be used for additional I/O pads. In some embodiments, the lateral spacing SP2 ranges from 100 to 400 μm.

In some embodiment, the long sides LS of the opening TH are defined by sloped sidewalls SW1. The sloped sidewalls SW1 may penetrate through the package substrate 104. In other words, the sloped sidewalls SW1 extend from the first side S1 of the package substrate 104 to the second side S2 of the package substrate 104 (or from the second side S2 to the first side S1). Since the opening TH is designed with the second width $W_{S2}$ greater than the first width $W_{S1}$, an angle $A_{S2}$ between each sidewall SW1 and the second side S2 of the package substrate 104 may be greater than 90°, while an angle $A_{S1}$ between each sidewall SW1 and the first side S1 of the package substrate 104 may be less than 90°. In some embodiments, the angle $A_{S2}$ ranges from 91° to 165°, while the angle $A_{S1}$ ranges from 15° to 90°.

Figure 1E:
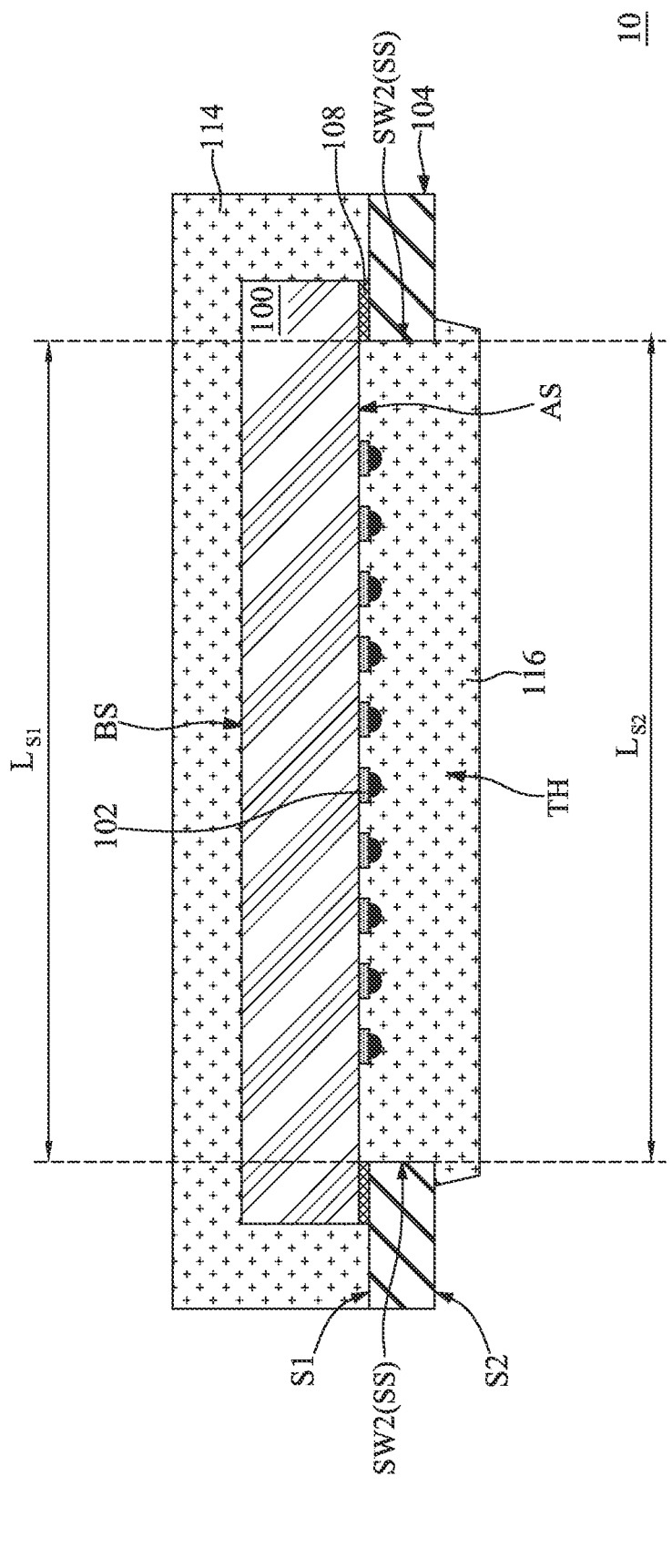
FIG. 1E is a schematic cross-sectional view illustrating the semiconductor package along the direction Y, according to some embodiments of the present disclosure.

FIG. 1E is a schematic cross-sectional view illustrating the semiconductor package 10 along the direction Y, according to some embodiments of the present disclosure.

Referring to FIG. 1C and FIG. 1E, the opening TH of the package substrate 104 has a first length $L_{S1}$ at the first side S1 of the package substrate 104, and has a second length $L_{S2}$ at the second side S2 of the package substrate 104. The first and second lengths $L_{S1}$, $L_{S2}$ are measured along a direction intersected with the short sides SS of the opening TH (i.e., the direction Y). In those embodiments where no bonding wires would extend across the short sides SS, the opening TH does not have to be designed with the second length $L_{S2}$ greater than the first length $L_{S1}$. In these embodiments, the first and second lengths $L_{S1}$, $L_{S2}$ may be substantially identical. Further, sidewalls SW2 defining the short sides SS of the opening TH may be substantially perpendicular to the first and second sides S1, S2 of the package substrate 104.

Referring to FIG. 1A and FIG. 1E, the semiconductor die 100 is encapsulated by an encapsulant 114. The encapsulant 114 is provided at the first side S1 of the package substrate 104, and laterally surrounds the semiconductor die 100. In those embodiments where the semiconductor die 100 is attached to the package substrate 104 via the adhesive 108, the adhesive 108 may be in lateral contact with the encapsulant 114. Further, in some embodiments, the semiconductor die 100 is over molded by the encapsulant 114. In these embodiments, a back side BS of the semiconductor die 100, which faces away from the active side AS of the semiconductor die 100, may be covered by the encapsulant 114. In addition, a thickness of the encapsulant 114 may be greater than a thickness of the semiconductor die 100.

Further, the opening TH of the package substrate 104 is filled by an encapsulant 116. Accordingly, the I/O pads 102 located within the opening TH are covered by the encapsulant 116, and a portion of the active side AS of the semiconductor die 100 surrounding the I/O pads 102 is in contact with the encapsulant 116. In addition, the sidewalls SW1, SW2 defining the long sides LS and the short sides SS of the opening TH are in lateral contact with the encapsulant 116. In some embodiments, the opening TH is filled up by the encapsulant 116, and the encapsulant 116 further extends onto the second side S2 of the package substrate 104. As shown in FIG. 1A, the conductive pads 112 at the second side S2 of the package substrate 104 and lined around the opening TH may be covered by the encapsulant 116. However, the encapsulant 116 may not extend to the package I/Os 106, and keeps an appropriate spacing from the package I/Os 106. In addition, a height of the encapsulant 116 by which the encapsulant 116 protrudes from the second side S2 of the package substrate 104 should be less than a height of the package I/Os 106, in order to prevent the package I/Os 106 from establishing contact with another package component.

As shown in FIG. 1D, a portion of the encapsulant 116 filled in the opening TH has a shape defined by the opening TH. Accordingly, a width of such portion of the encapsulant 116 at the first side S1 of the package substrate 104 is substantially equal to the width $W_{S1}$ of the opening TH, and a width of such portion of the encapsulant 116 at the second side S2 of the package substrate 104 is substantially equal to the width $W_{S2}$ of the opening TH. As described above, the width $W_{S2}$ is greater than the width $W_{S1}$.

Furthermore, as shown in FIG. 1E, a length of the portion of the encapsulant 116 at the first side S1 of the package substrate 104 is substantially equal to the length $L_{S1}$ of the opening TH, and a length of the portion of the encapsulant 116 at the second side S2 of the package substrate 104 is substantially equal to the length $L_{S2}$ of the opening TH. As described above, in some embodiments, the length $L_{S2}$ is substantially equal to the length $L_{S1}$.

As the package substrate 104 has the opening TH, the semiconductor die 100 can be attached to the package substrate 104 by a face down manner without using a flip chip bonding process. Instead of using a flip chip bonding process, a wire bonding process, which is more cost effective, is adopted for establishing electrical connection between the semiconductor die 100 and the package substrate 104. Particularly, the opening TH of the package substrate 104 is positioned with the I/O pads 102 of the semiconductor die 100, and the bonding wires 110 passing through the opening TH connect the I/O pads 102 to the other side of the package substrate 104. In addition, the opening TH is designed with a narrow end at the first side S1 of the package substrate 104 facing toward the semiconductor die 100, and a wide end at the second side S2 of the package substrate 104 facing away from the semiconductor die 100. As a result of such design, the edges $E_{S2}$ of the opening TH at the second side S2 of the package substrate 104 can be kept apart from the bonding wires 110 by an adequate distance. Therefore, the bonding wires 110 can be prevented from being damaged by the edges $E_{S2}$ during formation of the bonding wires 110, and the package substrate 104 can be avoided from being hit by the bonding tool used for forming the bonding wires 110. Further, as the bonding wires 110 can be safely kept apart from the edges $E_{S2}$, the I/O pads 102 can be disposed closer to the boundary of the opening TH, thus more area of the active side AS of the semiconductor die 100 is available for additional I/O pads.

Figure 2:
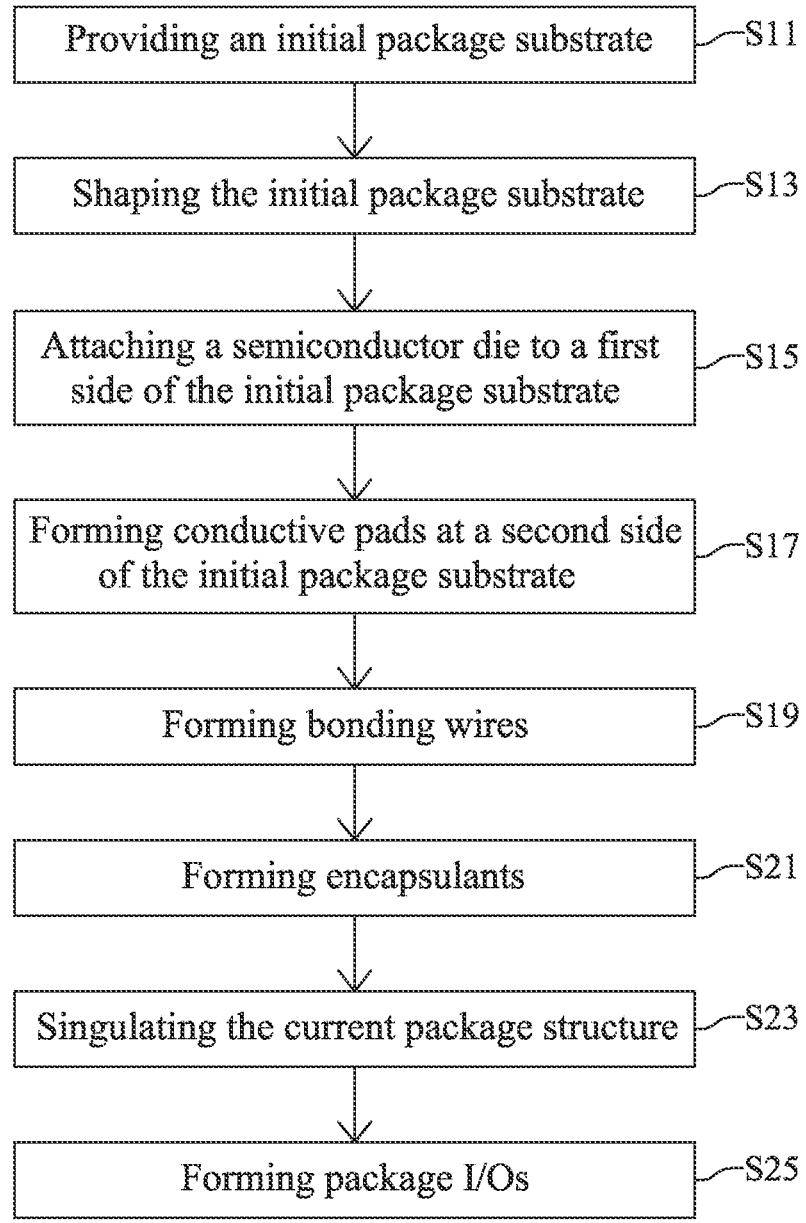
FIG. 2 is a flow diagram illustrating a method for forming the semiconductor package, according to some embodiments of the present disclosure.

FIG. 2 is a flow diagram illustrating a method for forming the semiconductor package 10, according to some embodiments of the present disclosure. FIG. 3A through FIG. 3H are schematic cross-sectional views illustrating intermediate structures along the direction X at various stages during the formation process shown in FIG. 2.

Figure 3A:
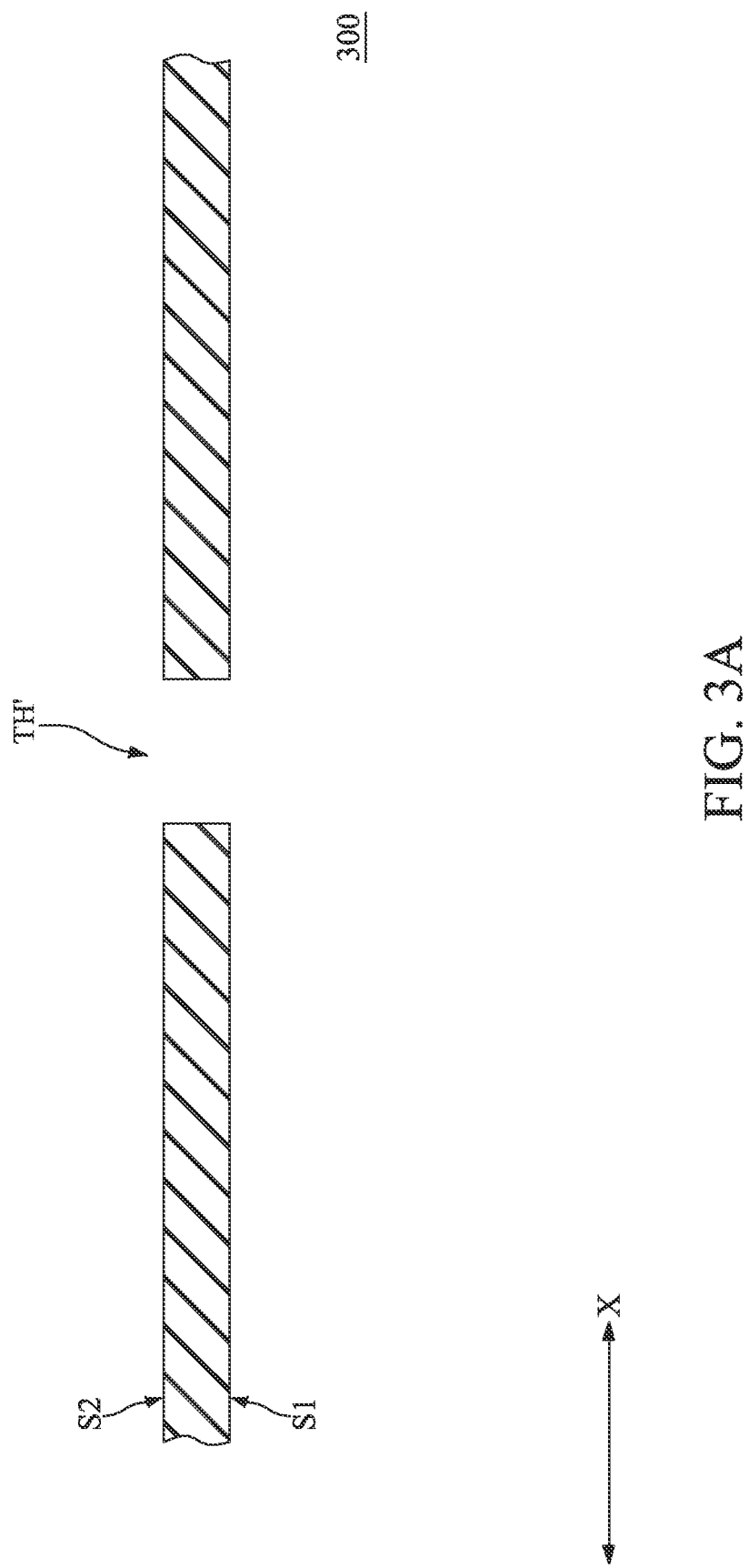
FIG. 3A through FIG. 3H are schematic cross-sectional views illustrating intermediate structures along the direction X at various stages during the formation process shown in FIG. 2.

Referring to FIG. 2 and FIG. 3A, a step S11 is performed, and an initial package substrate 300 is provided. The initial package substrate 300 will be shaped and singulated to form the package substrate 104 as described with reference to FIG. 1A and FIG. 1C through FIG. 1E. In other words, the initial package substrate 300 includes wirings embedded in a stack of insulating layers, and has the first side S1 to be attached with the semiconductor die 100 and the second side S2 opposite to the first side S1. In some embodiments, the initial package substrate 300 is provided with an opening TH' penetrating through the initial package substrate 300. The opening TH' is similar to the opening TH as described with reference to FIG. 1A and FIG. 1C through FIG. 1E, except that the opening TH' may have substantially identical width at both the first side S1 and the second side S2 of the package substrate 104.

Figure 3B:
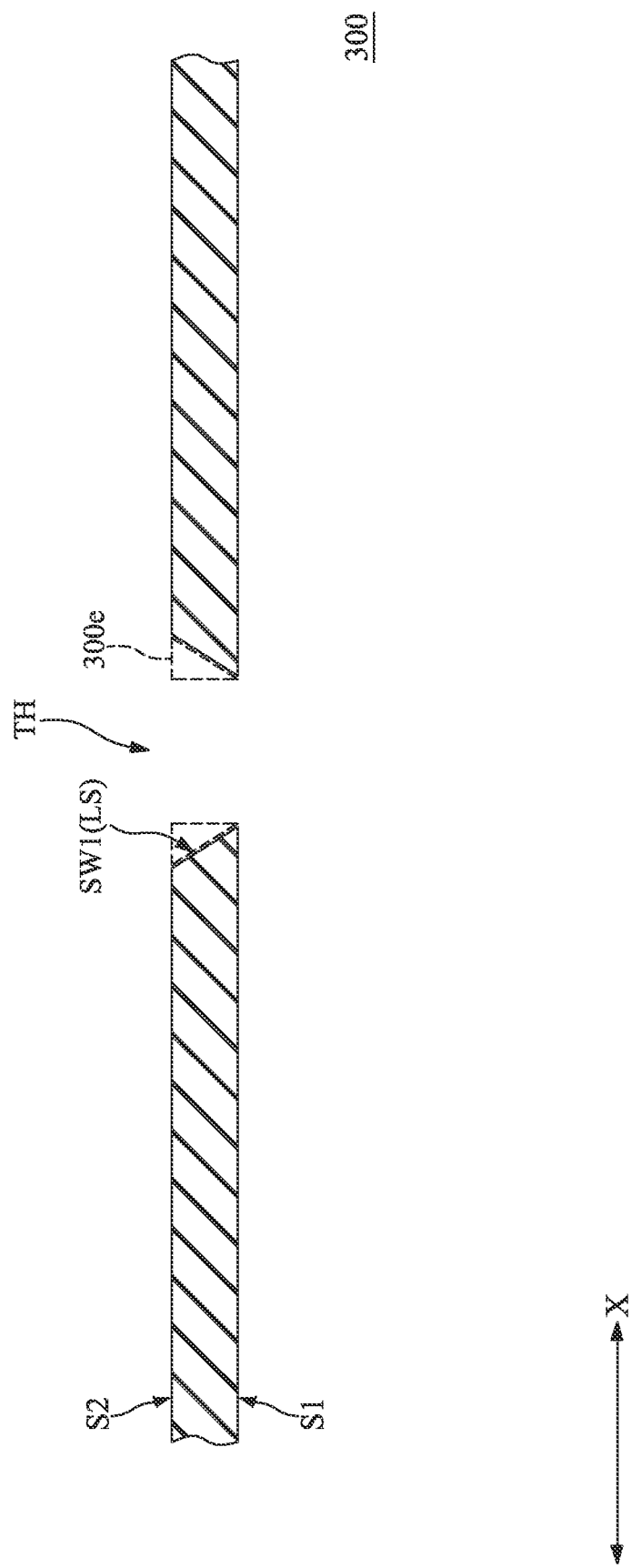

Referring to FIG. 2 and FIG. 3B, step S13 is performed, and the initial package substrate 300 is shaped. Edge portions 300e of the initial package substrate 300 extending along the long sides LS of the opening TH' are removed during the shaping, and the opening TH' turns into the opening TH as described with reference to FIG. 1A and FIG. 1C through FIG. 1E. In those embodiments where the opening TH has sloped sidewalls SW1 at the long sides LS, the removed edge portions 300e may be respectively in a wedge shape. Further, in some embodiments, the edge portions 300e of the initial package substrate 300 are removed by cutting the initial package substrate 300 from the second side S2 of the initial package substrate 300. As an example, a method for cutting the initial package substrate 300 may include a wet etching, a dry etching process with tile rotating substrate.

In alternative embodiments, the additional shaping step is omitted, and the initial package substrate 300 is provided with the opening TH, rather than the opening TH'.

Figure 3C:
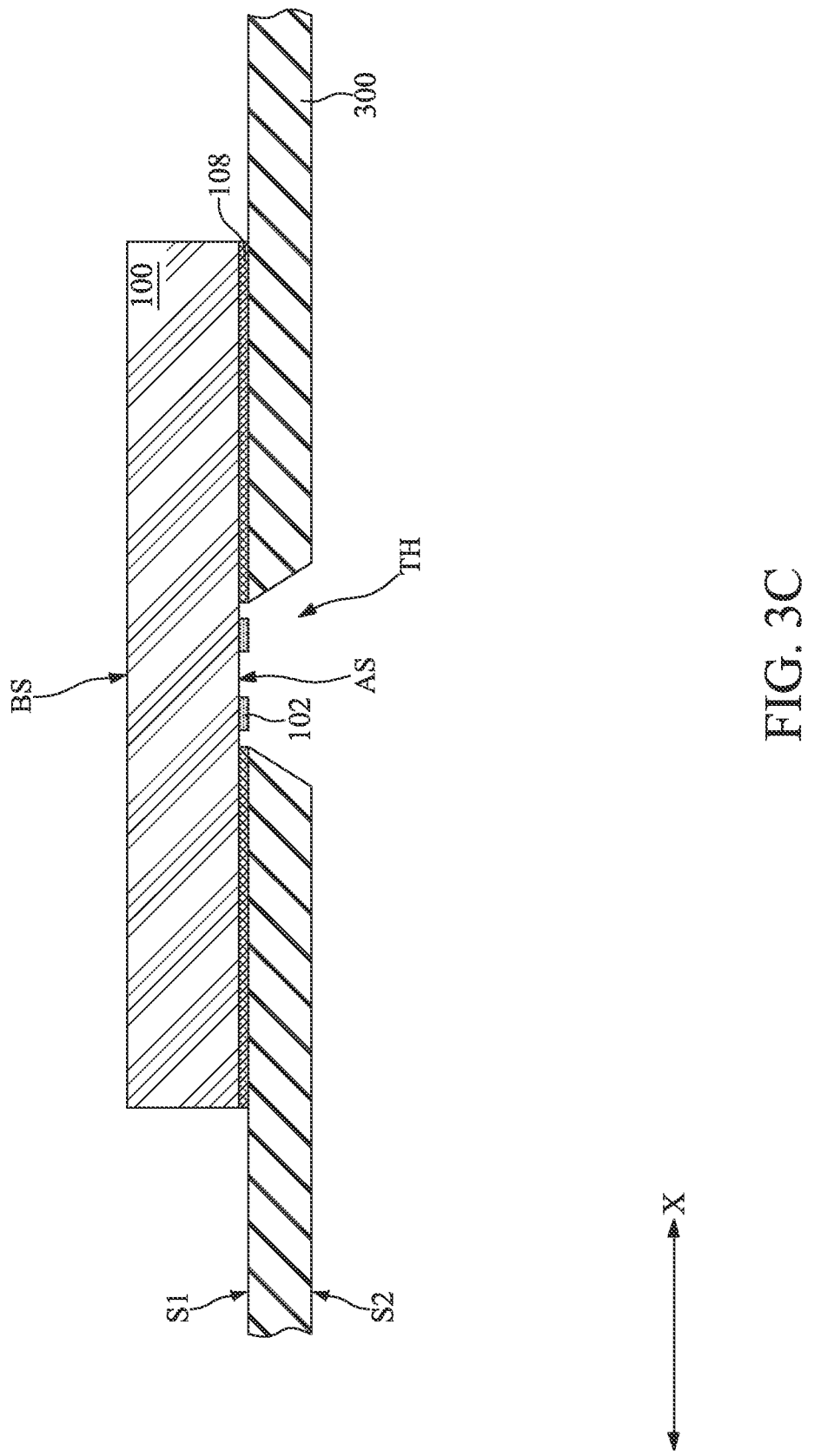

Referring to FIG. 2 and FIG. 3C, step S15 is performed, and the semiconductor die 100 is attached to the first side S1 of the initial package substrate 300. The initial package substrate 300 may be flipped over, such that the first side S1 of the initial package substrate 300 faces upwardly, and the semiconductor die 100 is attached to the initial package substrate 300 from above the initial package substrate 300. In addition, I/O pads 102 at the active side AS of the semiconductor die 100 are positioned with the opening TH of the initial package substrate 300 during the attachment, such that the I/O pads 102 can be exposed within the opening TH after the attachment. In some embodiments, the semiconductor die 100 is attached to the initial package substrate 300 via the adhesive 108. In these embodiments, the adhesive 108 may be provided on the active side AS of the semiconductor die 100 before the attachment. Alternatively, the adhesive 108 may be provided on the first side S1 of the initial package substrate 300 before the attachment.

Figure 3D:
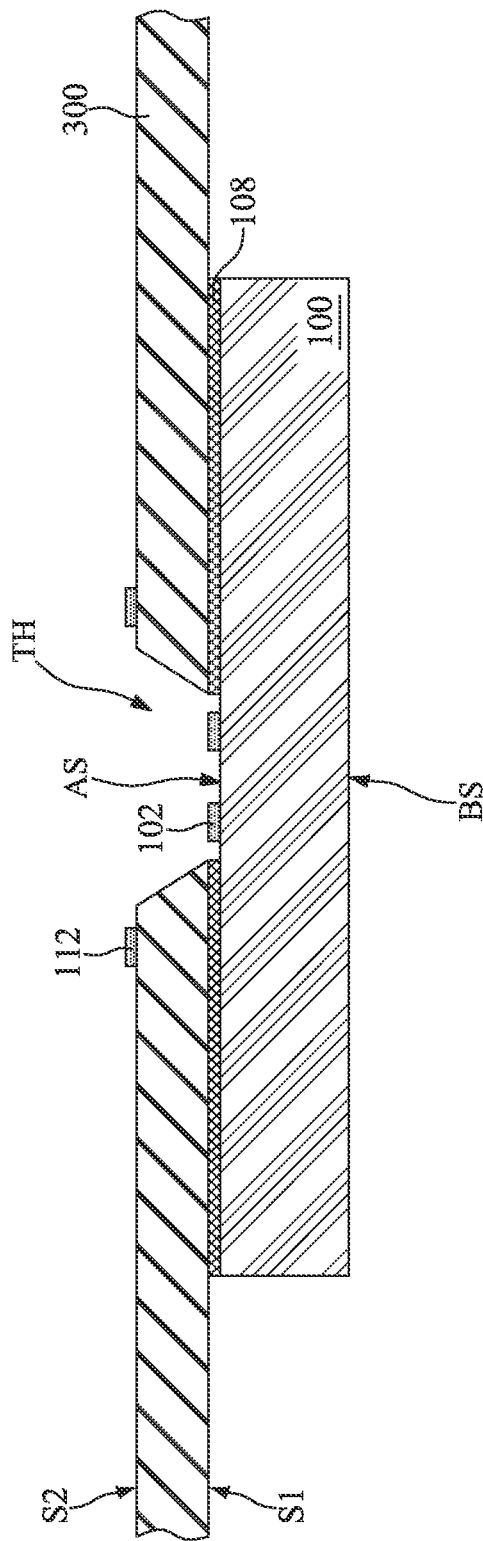

Referring to FIG. 2 and FIG. 3D, step S17 is performed, and the conductive pads 112 are formed at the second side S2 of the initial package substrate 300. Before formation of the conductive pads 112, the package structure shown in FIG. 3C may be flipped over, such that the second side S2 of the initial package substrate 300 faces upwardly. In addition, the package structure may be held from below the semiconductor die 100.

Figure 3E:
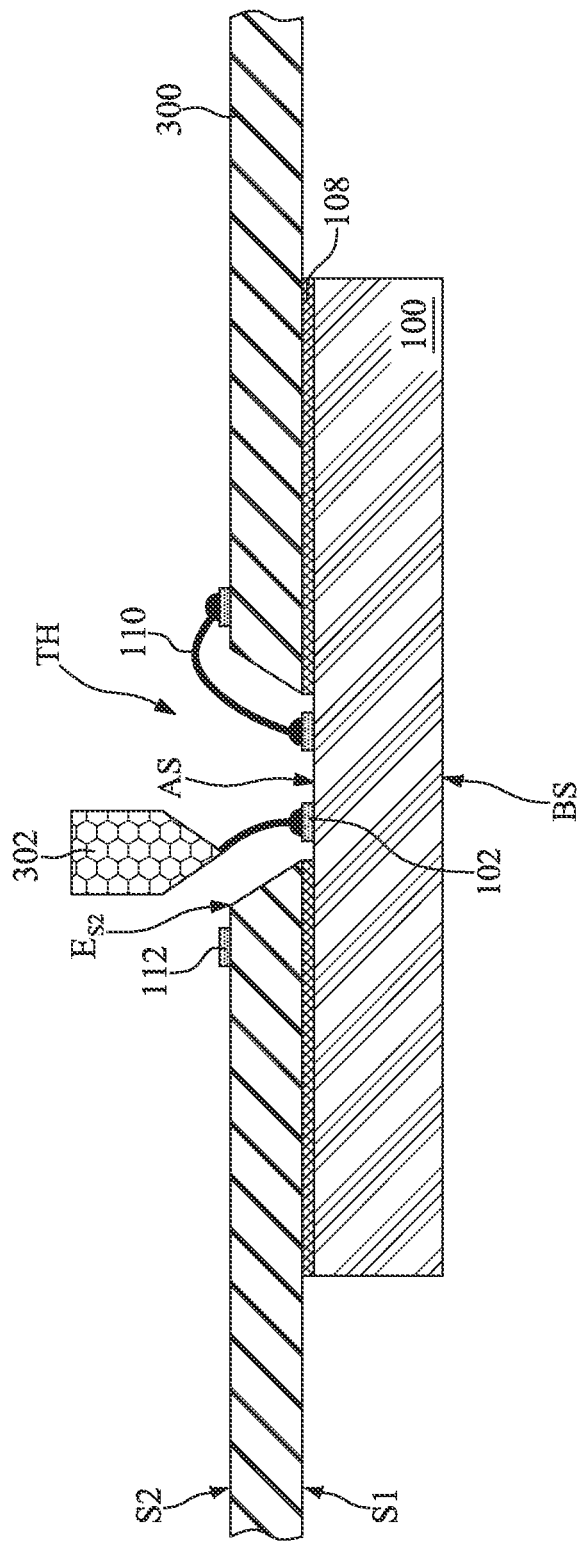

Referring to FIG. 2 and FIG. 3E, step S19 is performed, and the bonding wires 110 are formed. In some embodiments, a bonding tool 302 is used for forming the bonding wires 110. Although not shown, the bonding tool 302 has a hole extending into the bonding tool 302 from a capillary tip portion of the bonding tool 302. The formation of a bonding wire 110 may begin with a fine wire being threaded through the hole. The protruding wire is then heated by an electrical spark, and rolls back to form a ball, which is larger than a diameter of the hole. Subsequently, the ball is pressed onto an I/O pad 102 under application of heat (thermo-compression), ultrasound energy (ultrasonic) or both (thermosonic), to establish bonding with the I/O pad 102. The bonding tool 302 is then move toward a target conductive pad 112, and a wire portion of the bonding wire 110 is formed along. Since the opening TH is designed with a width at the second side S2 of the initial package substrate 300 greater than a width at the first side S1 of the initial package substrate 300, the bonding wire 110 can be avoided from being in physical contact with the edge $E_{S2}$, and the edge $E_{S2}$ can be prevented from being hit by the bonding tool 302. When the wire portion of the bonding wire 110 reaches the conductive pad 112, it is bonded with the conductive pad 112 via a process also used for establishing bonding with the I/O pad 102. The bonding wire 110 is formed accordingly.

Figure 3F:
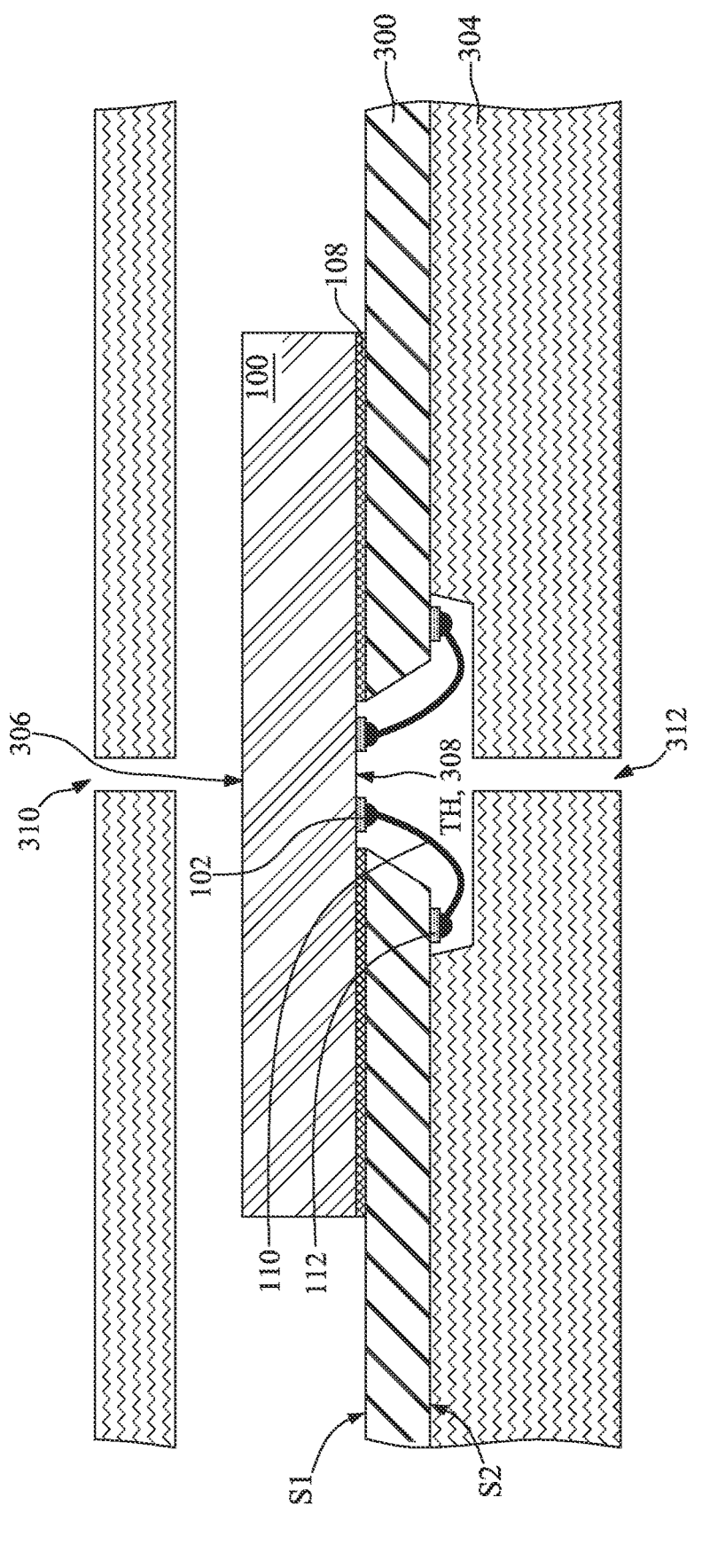
Figure 3G:
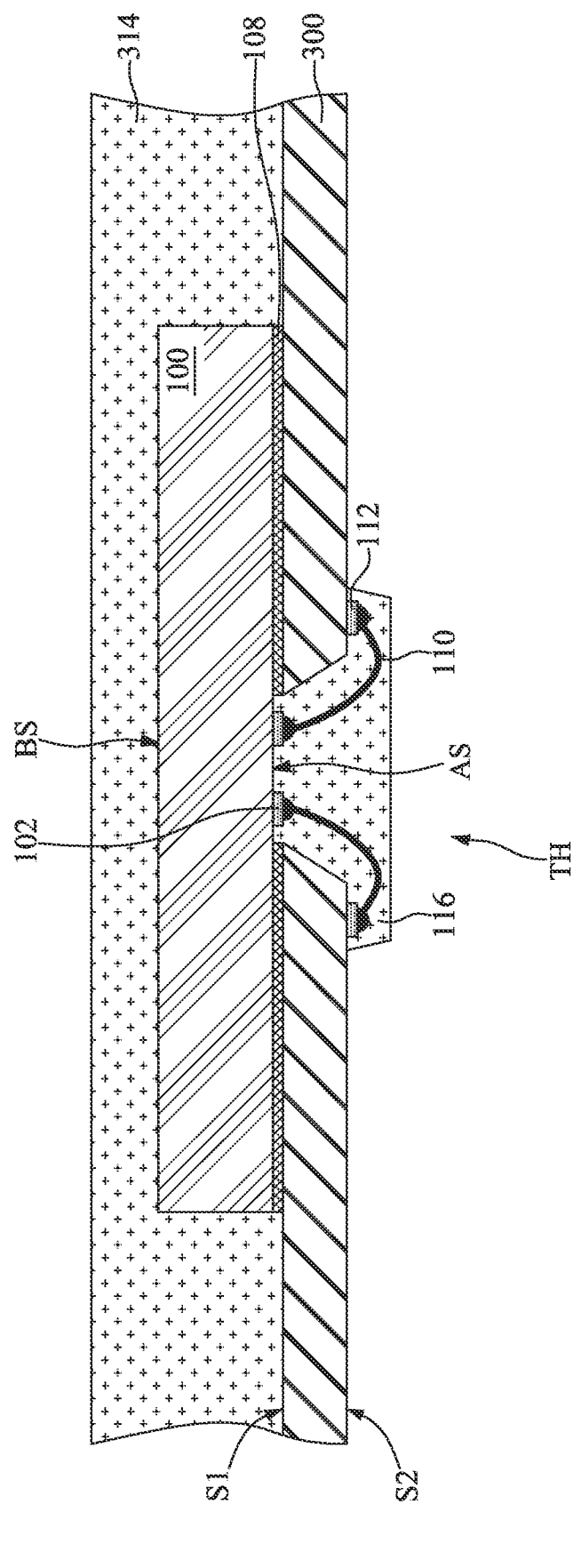

Referring to FIG. 2, FIG. 3F and FIG. 3G, step S21 is performed, and the encapsulants 114, 116 are formed. In some embodiments, as shown in FIG. 3F, the current package structure is placed in a mold 304 having cavities 306, 308 defining spaces to be filled with molding materials. A portion of the package structure at the first side S1 of the initial package substrate 300, which includes the semiconductor die 100 and the adhesive 108, may be accommodated in the cavity 306. On the other hand, the opening TH of the initial package substrate 300 is communicated with the cavity 308, and the I/O pads 102, the bonding wires 110 and the conductive pads 112 are accommodated in the cavity 308. Once the package structure is placed in the mold 304, a molding material may be provided to the cavity 306 through an inlet hole 310 communicated with the cavity 306. Similarly, a molding material may be provided to the cavity 308 through an inlet hole 312 communicated with the cavity 308. The molding material in the cavity 306 may be heated and cured to form an encapsulant 314 to be singulated to form the encapsulant 114 as described with reference to FIG. 1A, FIG. 1D and FIG. 1E. On the other hand, the molding material in the cavity 308 may be heated and cured to form the encapsulant 116 as described with reference to FIG. 1A, FIG. 1D and FIG. 1E. After formation of the encapsulants 314, 116 (as shown in FIG. 3G), the mold 304 is removed.

Figure 3H:
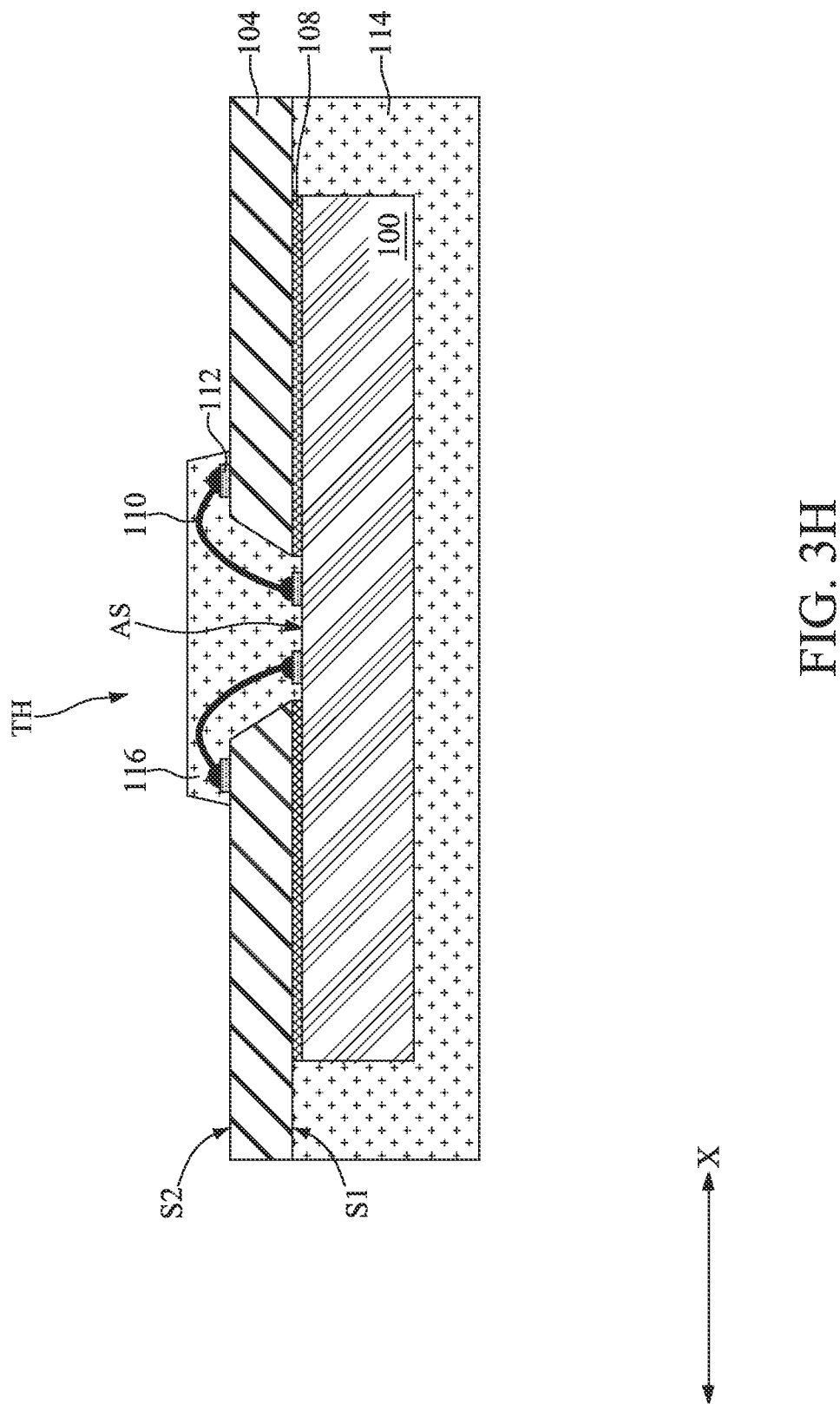

Referring to FIG. 2 and FIG. 3H, step S23 is performed, and the current package structure is singulated. Before the singulation, the current package structure may be flipped over, such that the second side S2 of the initial package substrate 300 faces upwardly, and the package structure may be supported from a side of the encapsulant 314 facing away from the initial package substrate 300. During the singulation, the initial package substrate 300 and the encapsulant 314 are cut into pieces including the package substrate 104 and the encapsulant 114 as described with reference to FIG. 1A and FIG. 1C through FIG. 1E. In some embodiments, sidewalls of the package substrate 104 are substantially coplanar with sidewalls of the encapsulant 114.

Referring to FIG. 2 and FIG. 1A, step S25 is performed, and the package I/Os 106 are formed. In those embodiments where the package I/Os 106 include the solder pastes 106a and the solder balls 106b, the solder pastes 106a are formed at the second side S2 of the package substrate 104, then the solder balls 106b are provided on the solder pastes 106a. In addition, the solder pastes 104a and the solder balls 106b may be subjected to at least one thermal treatment, to be formed in expected shapes.

Up to here, the semiconductor package 10 as described with reference to FIG. 1A through FIG. 1E has been formed by a process according to some embodiments of the present disclosure. In alternative embodiments, formation of the package I/Os 106 (i.e., the step S25 as described with reference to FIG. 2 and FIG. 1A) precedes the singulation step (i.e., the step S23 described with reference to FIG. 2 and FIG. 3H). Moreover, in some embodiments, the formed semiconductor package 10 may be further attached to another package component (e.g., a printed circuit board) via the package I/Os 106.

Figure 4A:
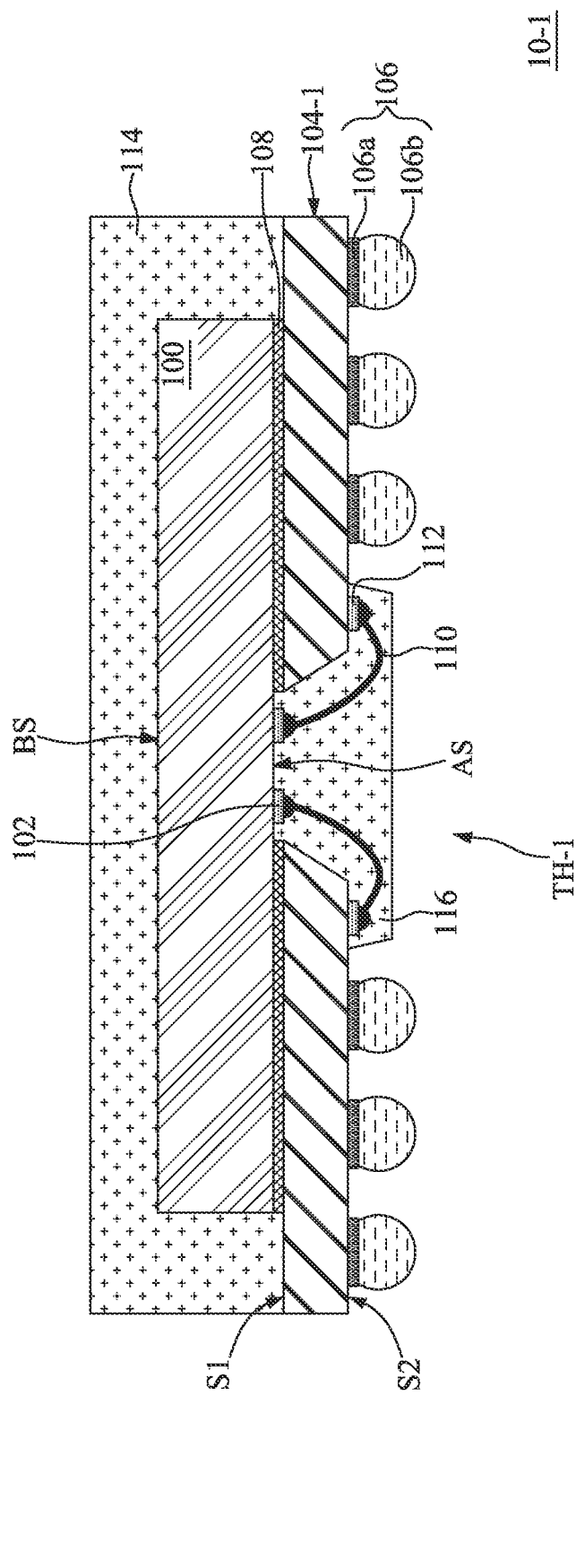
FIG. 4A is a schematic cross-sectional view illustrating a semiconductor package according to some embodiments of the present disclosure.
Figure 4B:
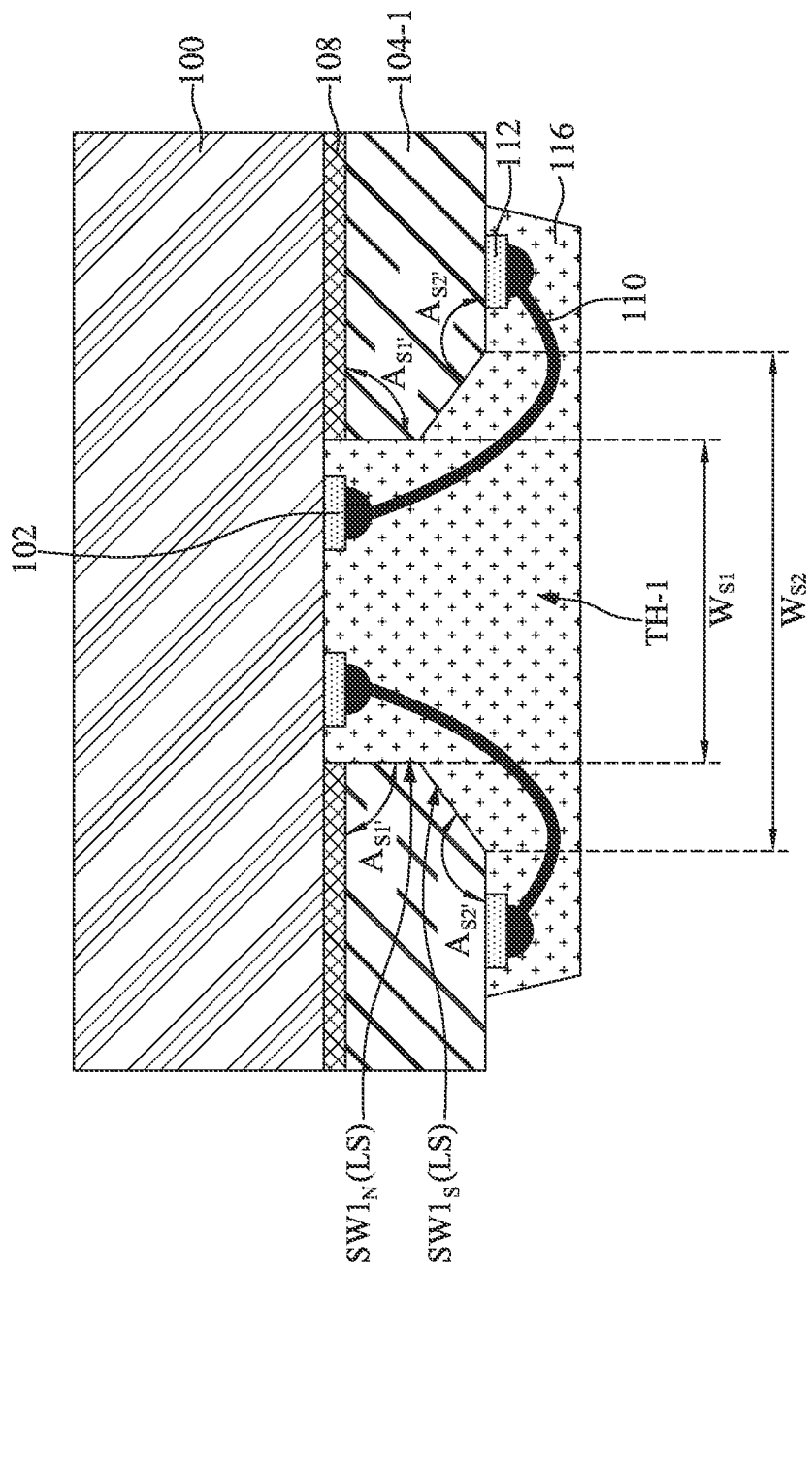
FIG. 4B is an enlarged schematic view illustrating an opening of a package substrate in the semiconductor package as shown in FIG. 4A.

FIG. 4A is a schematic cross-sectional view illustrating a semiconductor package 10-1 according to some embodiments of the present disclosure. FIG. 4B is an enlarged schematic view illustrating an opening TH-1 of a package substrate 104-1 in the semiconductor package 10-1 as shown in FIG. 4A.

Referring to FIG. 4A and FIG. 4B, the semiconductor package 10-1 is similar to the semiconductor package 10 described with reference to FIG. 1A through FIG. 1E, as the package substrate 104-1 of the semiconductor package 10-1 has the opening TH-1 also designed with a width $W_{S2}$ at the second side S2 of the package substrate 104-1 greater than a width $W_{S1}$ at the first side S1 of the package substrate 104-1. As different from the package substrate 104 of the semiconductor package 10 described with reference to FIG. 1A through FIG. 1E, each long side LS of the opening TH-1 in the package substrate 104-1 is defined by a sidewall $SW1_N$ and a sidewall $SW1_S$. The sidewall $SW1_N$ may extend from the first side S1 of the package substrate 104-1 to a joint of the sidewalls $SW1_N$, $SW1_S$, while the sidewall $SW1_S$ may extend from the second side S2 of the package substrate 104-2 to the joint. An angle $A_{S1'}$ between the sidewall $SW1_N$ and the first side S1 of the package substrate 104-1 may be less than or equal to 90°. On the other hand, the sidewall $SW1_S$ may be a sloped sidewall, and an angle $A_{S2'}$ between the sidewall $SW1_S$ and the second side S2 of the package substrate 104-1 is greater than 90°. In some embodiments, the angle $A_{S2'}$ ranges from 91° to 165°.

Figure 5A:
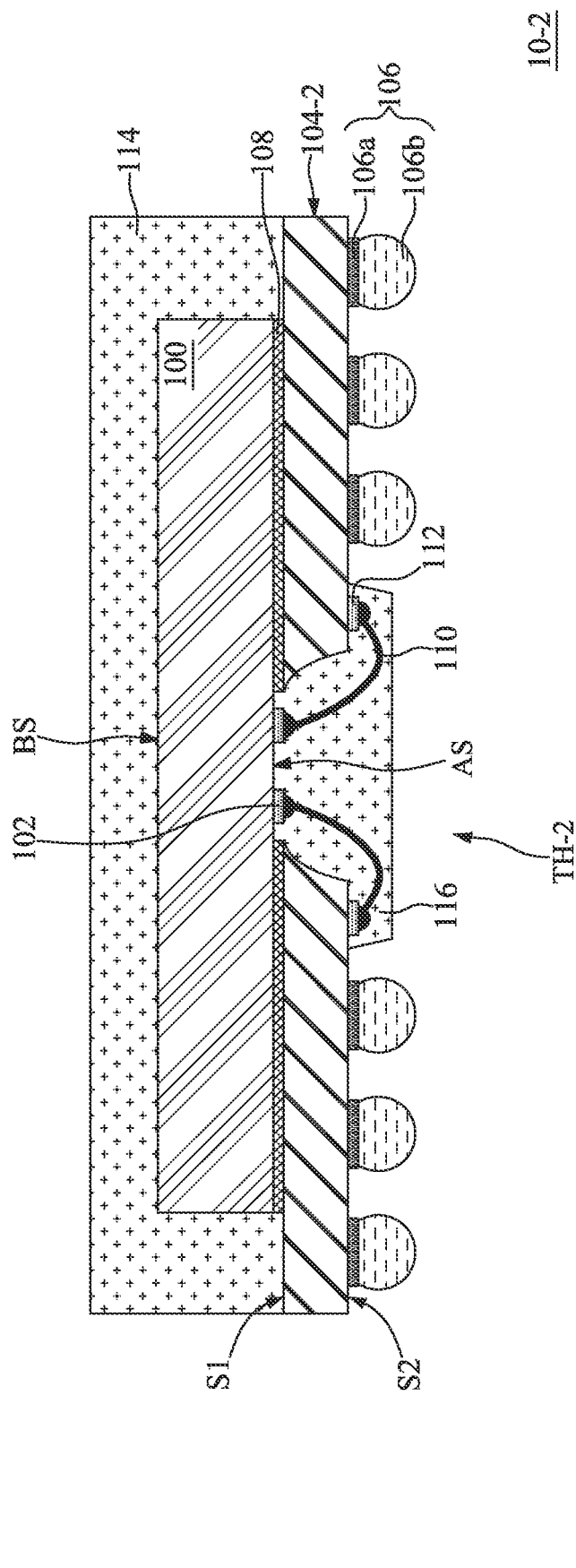
FIG. 5A is a schematic cross-sectional view illustrating a semiconductor package according to some embodiments of the present disclosure.
Figure 5B:
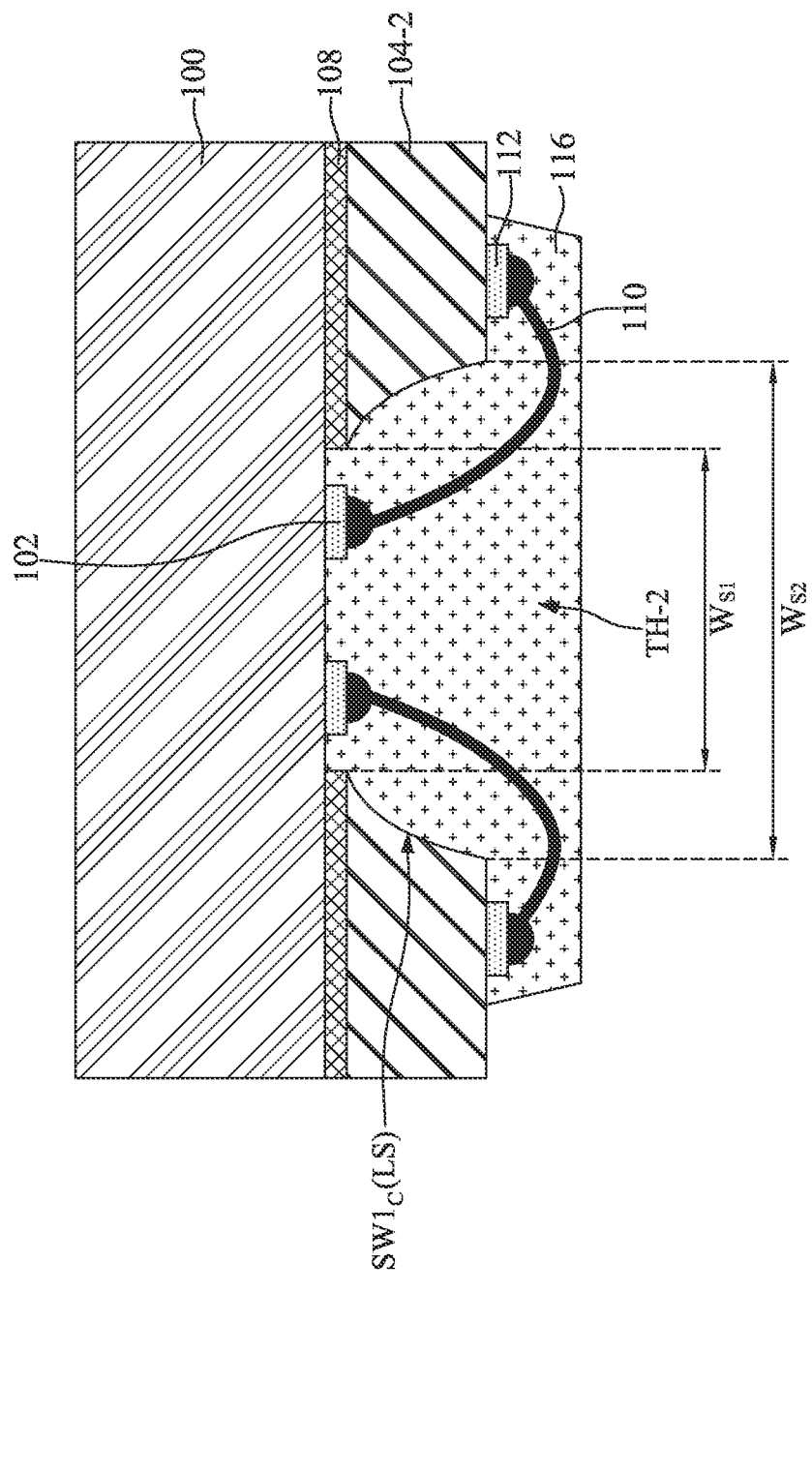
FIG. 5B is an enlarged schematic view illustrating an opening of a package substrate in the semiconductor package 10-2 as shown in FIG. 5A.

FIG. 5A is a schematic cross-sectional view illustrating a semiconductor package 10-2 according to some embodiments of the present disclosure. FIG. 5B is an enlarged schematic view illustrating an opening TH-2 of a package substrate 104-2 in the semiconductor package 10-2 as shown in FIG. 5A.

Referring to FIG. 5A and FIG. 5B, the semiconductor package 10-2 is similar to the semiconductor package 10 described with reference to FIG. 1A through FIG. 1E, as the package substrate 104-2 of the semiconductor package 10-2 has the opening TH-2 also designed with a width $W_{S2}$ at the second side S2 of the package substrate 104-2 greater than a width $W_{S1}$ at the first side S1 of the package substrate 104-2. As different from the package substrate 104 of the semiconductor package 10 described with reference to FIG. 1A through FIG. 1E, each long side LS of the opening TH-2 in the package substrate 104-2 is defined by a curved sidewall $SW1_C$. The curved sidewall $SW1_C$ may be a concave surface arched into the package substrate 104-2, and may extend from the first side S1 to the second side S2 of the package substrate 104-2 (or vice versa).

Figure 6A:
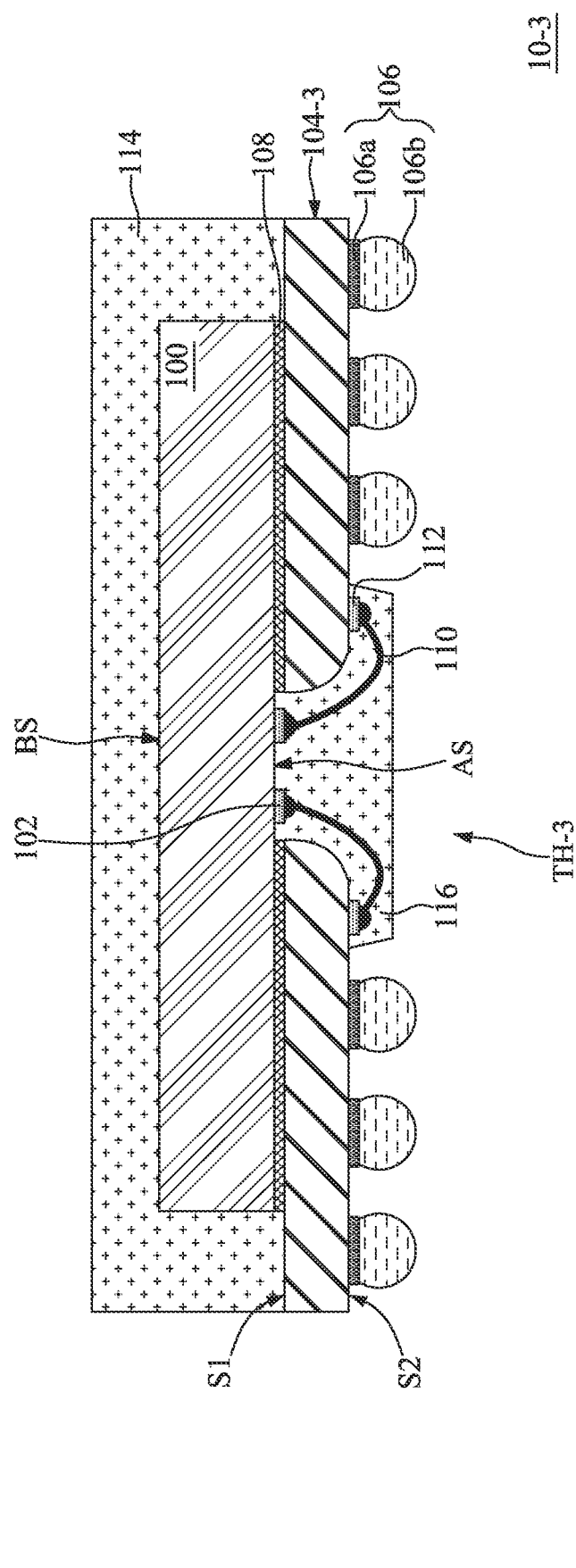
FIG. 6A is a schematic cross-sectional view illustrating a semiconductor package according to some embodiments of the present disclosure.
Figure 6B:
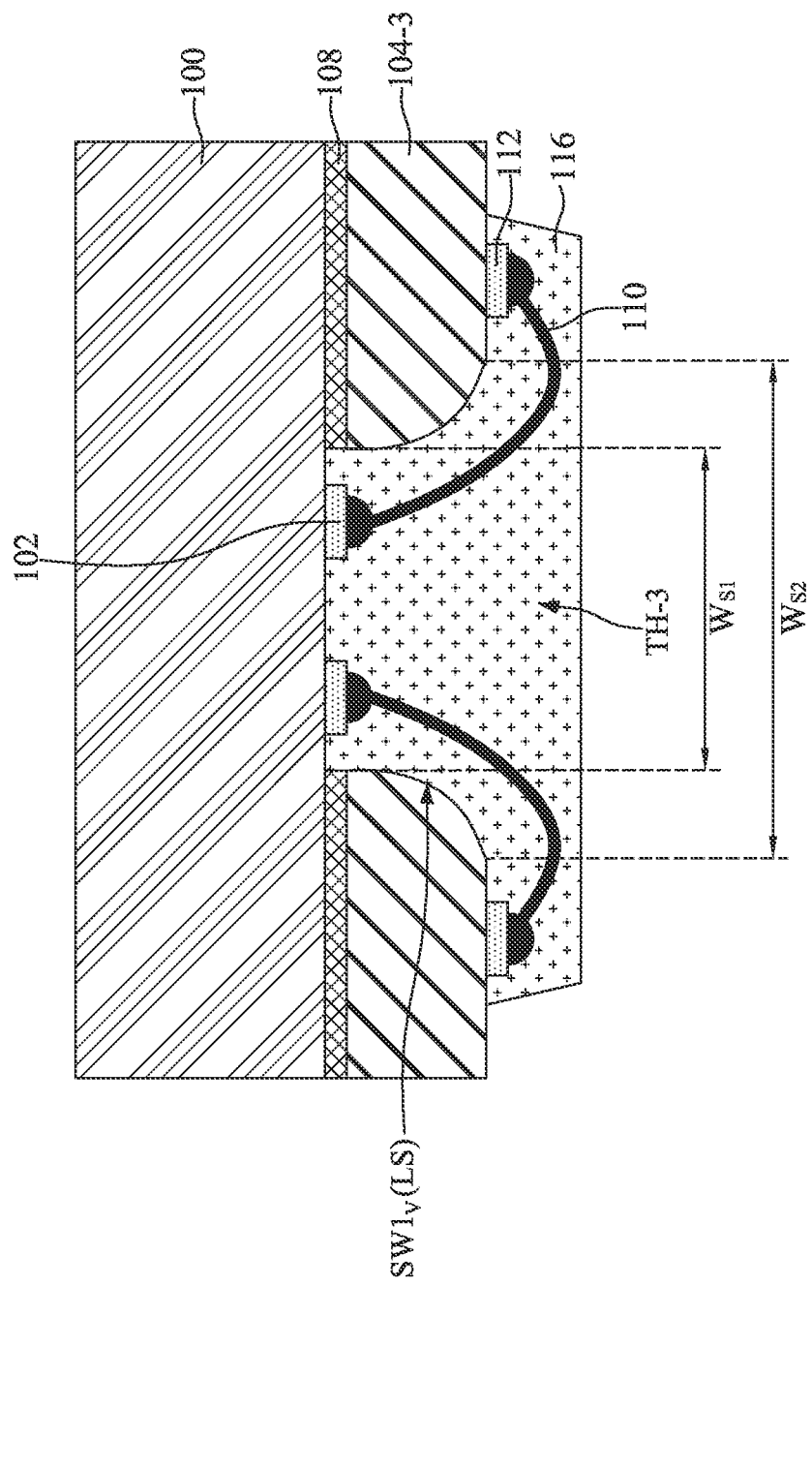
FIG. 6B is an enlarged schematic view illustrating an opening of a package substrate in the semiconductor package as shown in FIG.

FIG. 6A is a schematic cross-sectional view illustrating a semiconductor package 10-3 according to some embodiments of the present disclosure. FIG. 6B is an enlarged schematic view illustrating an opening TH-3 of a package substrate 104-3 in the semiconductor package 10-3 as shown in FIG. 6A.

Referring to FIG. 6A and FIG. 6B, the semiconductor package 10-3 is similar to the semiconductor package 10 described with reference to FIG. 1A through FIG. 1E, as the package substrate 104-3 of the semiconductor package 10-3 has the opening TH-3 also designed with a width $W_{S2}$ at the second side S2 of the package substrate 104-3 greater than a width $W_{S1}$ at the first side S1 of the package substrate 104-3. As different from the package substrate 104 of the semiconductor package 10 described with reference to FIG. 1A through FIG. 1E, each long side LS of the opening TH-3 in the package substrate 104-3 is defined by a curved sidewall $SW1_V$. The curved sidewall $SW1_V$ may be a convex surface rounded outward, and may extend from the first side S1 to the second side S2 of the package substrate 104-3 (or vice versa).

Figure 7:
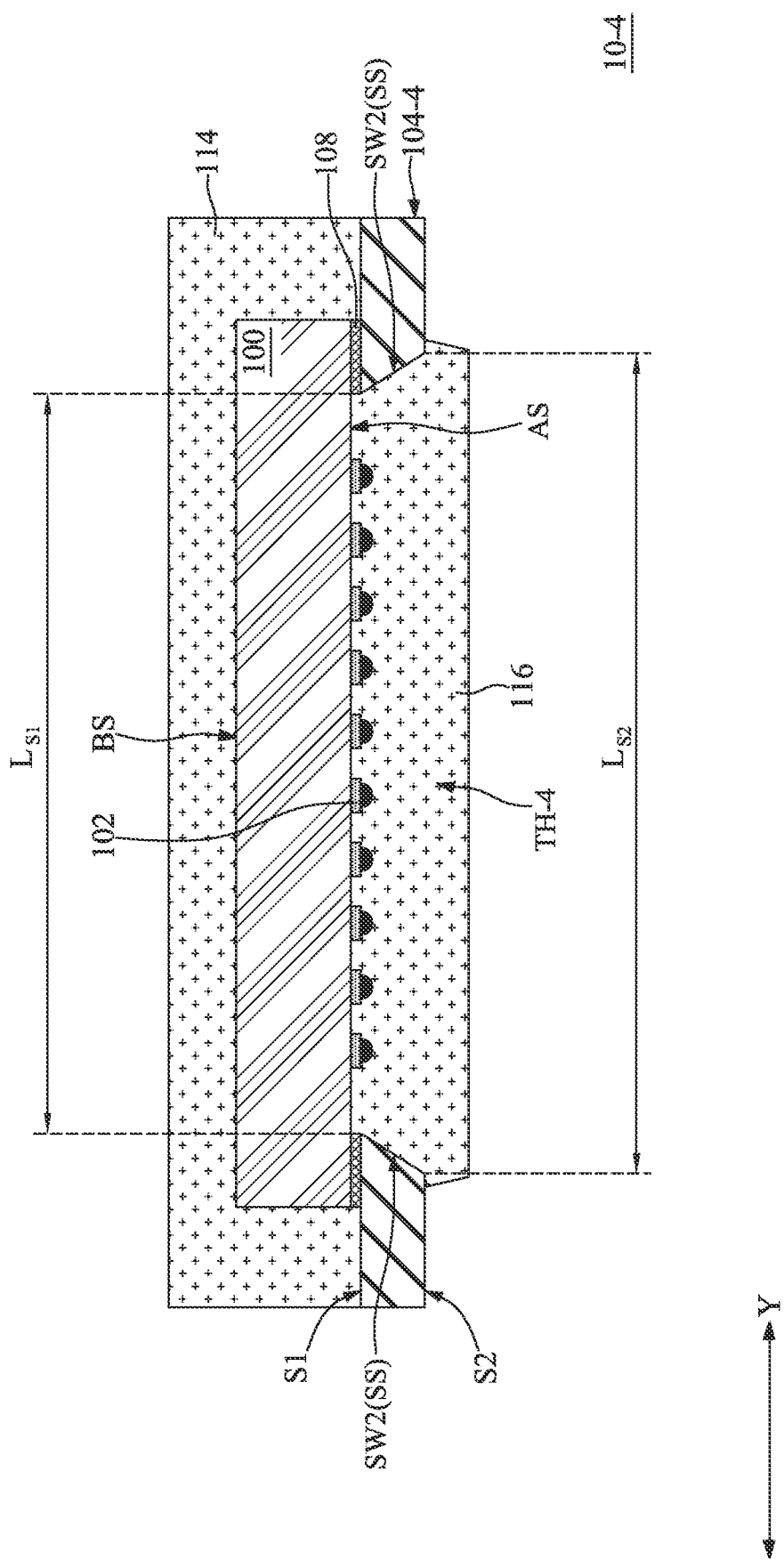
FIG. 7 is a schematic cross-sectional view illustrating a semiconductor package, according to some embodiments of the present disclosure.

FIG. 7 is a schematic cross-sectional view illustrating a semiconductor package 10-4, according to some embodiments of the present disclosure.

The semiconductor package 10-4 is similar to the semiconductor package 10 as described with reference to FIG. 1A through FIG. 1E, except that an opening TH-4 in a package substrate 104-4 of the semiconductor package 10-4 is designed with a length $L_{S2}$ at the second side S2 of the package substrate 104-4 greater than a length $L_{S1}$ at the first side S1 of the package substrate 104-4. As described above, the lengths $L_{S1}$, $L_{S2}$ are measured along a direction intersected with the short sides SS of the opening TH-4 (e.g., the direction Y). Further, each short side SS of the opening TH-4 may be defined by a sidewall SW2 extending from the first side S1 to the second side S2 of the package substrate 104-4 (or vice versa). The sidewall SW2 may be a sloped sidewall, or a curved sidewall as similar to the sidewall $SW1_C$ described with reference to FIG. 5B or the sidewall $SW1_V$ described with reference to FIG. 6B. In yet other embodiments, each short side SS of the opening TH-4 is defined by jointed sidewalls, as similar to the sidewalls $SW1_N$, $SW1_S$ described with reference to FIG. 4B.

As above, the semiconductor package according to various embodiments of the present disclosure includes a package substrate with an opening. A semiconductor die can be attached to the package substrate by a face down manner without using a flip chip bonding process. Instead of using a flip chip bonding process, a wire bonding process, which is more cost effective, is adopted for establishing electrical connection between the semiconductor die and the package substrate. Particularly, the opening of the package substrate is positioned with I/O pads at an active side of the semiconductor die, and bonding wires passing through the opening connect the I/O pads to the other side of the package substrate. In addition, the opening is designed with a narrow end at a first side of the package substrate facing toward the semiconductor die, and a wide end at a second side of the package substrate facing away from the semiconductor die. As a result of such design, edges of the opening at the second side of the package substrate can be kept apart from the bonding wires by an adequate distance. Therefore, the bonding wires can be prevented from being damaged by the edges during formation of the bonding wires, and the package substrate can be avoided from being hit by a bonding tool used for forming the bonding wires. Further, as the bonding wires can be safely kept apart from the edges, the I/O pads can be disposed closer to the boundary of the opening, thus more area of the active side of the semiconductor die is available for additional I/O pads.

In an aspect of the present disclosure, a semiconductor package is provided. The semiconductor package comprises: a semiconductor die, having I/O pads arranged at an active side of the semiconductor die; a package substrate, with a first side attached to the active side of the semiconductor die and a second side facing away from the semiconductor die, and having an opening penetrating through the package substrate, wherein the I/O pads are overlapped with the opening, and a width of the opening at the second side of the package substrate is greater than a width of the opening at the first side of the package substrate; and bonding wires, connecting the I/O pads to the second side of the package substrate through the opening of the package substrate.

In another aspect of the present disclosure, a semiconductor package is provided. The semiconductor package comprises: a semiconductor die, having I/O pads arranged at an active side of the semiconductor die; a package substrate, with a first side attached to the active side of the semiconductor die and a second side facing away from the semiconductor die, and laterally surrounding an opening, wherein the I/O pads are overlapped with the opening, the opening has long sides and short sides, a width across the long sides of the opening at the second side of the package substrate is greater than a width across the long sides the opening at the first side of the package substrate; and bonding wires, connecting the I/O pads to the second side of the package substrate across the long sides of the opening.

In yet another aspect of the present disclosure, a semiconductor package is provided. The semiconductor package comprises: a semiconductor die, having I/O pads arranged at an active side of the semiconductor die; a package substrate, with a first side attached to the active side of the semiconductor die and a second side facing away from the semiconductor die, and having an opening penetrating through the package substrate, wherein the I/O pads are overlapped with the opening, and a width of the opening at the second side of the package substrate is greater than a width of the opening at the first side of the package substrate; bonding wires, connecting the I/O pads to the second side of the package substrate through the opening of the package substrate; a first encapsulant, laterally encapsulating the semiconductor die; and a second encapsulant, filling up the opening and extending to the second side of the package substrate.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:
1. A semiconductor package, comprising:
a semiconductor die, having I/O pads arranged at an active side of the semiconductor die;
a package substrate, with a first side attached to the active side of the semiconductor die and a second side facing away from the semiconductor die, and having an opening penetrating through the package substrate, wherein the I/O pads are overlapped with the opening; and
bonding wires, including a first end contacted with the I/O pads and a second end contacted with a bottommost surface of the second side of the package substrate, and the bonding wires connecting the I/O pads to the bottommost surface of the second side of the package substrate through the opening of the package substrate;
wherein the opening includes edges at the bottommost surface of the second side of the package substrate and coplanar with the second end of the bonding wires, the bonding wires extend from the first end connected to the I/O pads, over the edges of the opening, to the second end connected to the bottommost surface of the second side of the package substrate, the second end of the bonding wires are deposited away from the edges of the opening, a width between adjacent two of the edges of the opening at the bottommost surface of the second side of the package substrate is greater than a width of the opening at the first side of the package substrate.

2. The semiconductor package according to claim 1, wherein an angle defined between the bottommost surface of the second side of the package substrate and a sidewall of the opening across which a group of the bonding wires extend is greater than 90°.

3. The semiconductor package according to claim 2, wherein an angle defined between the first side of the package substrate and the sidewall of the opening is less than 90°.

4. The semiconductor package according to claim 3, wherein the sidewall of the opening is a sloped sidewall.

5. The semiconductor package according to claim 2, wherein the sidewall of the opening extends from the bottommost surface of the second side of the package substrate to a joint shared with another sidewall of the opening extending from the joint to the first side of the package substrate.

6. The semiconductor package according to claim 5, wherein an angle defined between the first side of the package substrate and the sidewall of the opening extending from the joint to the first side of the package substrate is equal to or less than 90°.

7. The semiconductor package according to claim 1, wherein a sidewall of the opening across which a group of the bonding wires extend is a curved sidewall.

8. The semiconductor package according to claim 7, wherein the sidewall arches into the package substrate.

9. The semiconductor package according to claim 7, wherein the sidewall is rounded into opening.

10. A semiconductor package, comprising:
a semiconductor die, having I/O pads arranged at an active side of the semiconductor die;
a package substrate, with a first side attached to the active side of the semiconductor die and a second side facing away from the semiconductor die, and laterally surrounding an opening, wherein the I/O pads are overlapped with the opening, the opening has long sides and short sides; and
bonding wires, including a first end contacted with the I/O pads and a second end contacted with a bottommost surface of the second side of the package substrate, and the bonding wires connecting the I/O pads to the bottommost surface of the second side of the package substrate across the long sides of the opening;
wherein the opening includes edges at the bottommost surface of the second side of the package substrate and coplanar with the second end of the bonding wires, the bonding wires extend from the first end connected to the I/O pads, over the edges of the opening, to the second end connected to the bottommost surface of the second side of the package substrate, the second end of the bonding wires are deposited away from the edges of the opening, a width between adjacent two of the edges and across the long sides of the opening at the bottommost surface of the second side of the package substrate is greater than a width across the long sides the opening at the first side of the package substrate.

11. The semiconductor package according to claim 10, wherein a length across the short sides of the opening at the bottommost surface of the second side of the package substrate is substantially equal to a length across the short sides of the opening at the first side of the package substrate.

12. The semiconductor package according to claim 10, wherein a length across the short sides of the opening at the bottommost surface of the second side of the package substrate is greater than a length across the short sides of the opening at the first side of the package substrate.

13. The semiconductor package according to claim 10, wherein each long side of the opening is defined by a sloped sidewall.

14. The semiconductor package according to claim 10, wherein each long side of the opening is defined by a first sidewall and a second sidewall jointed with the first sidewall, and extending directions of the first sidewall and second sidewall are different from each other.

15. The semiconductor package according to claim 10, wherein each long side of the opening is defined by a curved sidewall.

16. A semiconductor package, comprising:
a semiconductor die, having I/O pads arranged at an active side of the semiconductor die;

a package substrate, with a first side attached to the active side of the semiconductor die and a second side facing away from the semiconductor die, and having an opening penetrating through the package substrate, wherein the I/O pads are overlapped with the opening;

bonding wires, including a first end contacted with the I/O pads and a second end contacted with a bottommost surface of the second side of the package substrate, and the bonding wires connecting the I/O pads to the bottommost surface of the second side of the package substrate through the opening of the package substrate;

a first encapsulant, laterally encapsulating the semiconductor die; and a second encapsulant, filling up the opening and extending to the bottommost surface of the second side of the package substrate;

wherein the opening includes edges at the bottommost surface of the second side of the package substrate and coplanar with the second end of the bonding wires, the bonding wires extend from the first end connected to the I/O pads, over the edges of the opening, to the second end connected to the bottommost surface of the second side of the package substrate, the second end of the bonding wires are deposited away from the edges of the opening, a width between adjacent two of the edges of the opening at the bottommost surface of the second side of the package substrate is greater than a width of the opening at the first side of the package substrate.

17. The semiconductor package according to claim 16, wherein a portion of the second encapsulant filled in the opening has a first width at the first side of the package substrate and a second width at the bottommost surface of the second side of the package substrate, and the second width is greater than the first width.

18. The semiconductor package according to claim 16, further comprising:
   conductive pads, formed at the bottommost surface of the second side of the package substrate, and connected to the bonding wires.

19. The semiconductor package according to claim 18, wherein the conductive pads are covered by the second encapsulant.

20. The semiconductor package according to claim 18, wherein the opening has long sides and short sides, and the conductive pads are arranged along the long sides of the opening.

* * * * *